United States Patent
Russell et al.

(10) Patent No.: US 12,219,883 B2
(45) Date of Patent: *Feb. 4, 2025

(54) TECHNIQUES FOR FORMING SELF-ALIGNED MEMORY STRUCTURES

(71) Applicant: Micron Technology, Inc., Boise, ID (US)

(72) Inventors: Stephen W. Russell, Boise, ID (US); Andrea Redaelli, Calolziocorte (IT); Innocenzo Tortorelli, Cernusco sul Naviglio (IT); Agostino Pirovano, Milan (IT); Fabio Pellizzer, Boise, ID (US); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 128 days.

This patent is subject to a terminal disclaimer.

(21) Appl. No.: 17/881,274

(22) Filed: Aug. 4, 2022

(65) Prior Publication Data

US 2023/0027799 A1     Jan. 26, 2023

Related U.S. Application Data

(63) Continuation of application No. 16/539,932, filed on Aug. 13, 2019, now Pat. No. 11,417,841.

(51) Int. Cl.
*H10N 70/00* (2023.01)
*H10B 63/00* (2023.01)
*H10N 70/20* (2023.01)

(52) U.S. Cl.
CPC .......... *H10N 70/066* (2023.02); *H10B 63/84* (2023.02); *H10N 70/063* (2023.02); *H10N 70/24* (2023.02); *H10N 70/826* (2023.02)

(58) Field of Classification Search
None
See application file for complete search history.

(56) References Cited

U.S. PATENT DOCUMENTS 9,306,165 B2    4/2016  Lee et al.
11,417,841 B2 *  8/2022  Russell ............... H10N 70/066
(Continued)

FOREIGN PATENT DOCUMENTS

KR    10-2009-0090003 A    8/2009
KR    10-2010-0075015 A    7/2010
(Continued)

OTHER PUBLICATIONS

Japan Patent Office, "Office Action," issued in connection with Japan Patent Application No. 2022-508759 dated May 30, 2023 (12 pages with machine translation).
(Continued)

*Primary Examiner* — Jay C Chang
(74) *Attorney, Agent, or Firm* — Holland & Hart LLP

(57) ABSTRACT

Methods, systems, and devices for techniques for forming self-aligned memory structures are described. Aspects include etching a layered assembly of materials including a first conductive material and a first sacrificial material to form a first set of channels along a first direction that creates a first set of sections. An insulative material may be deposited within each of the first set of channels and a second sacrificial material may be deposited onto the first set of sections and the insulating material. A second set of channels may be etched into the layered assembly of materials along a second direction that creates a second set of sections, where the second set of channels extend through the first and second sacrificial materials. Insulating material may be
(Continued)

deposited in the second set of channels and the sacrificial materials removed leaving a cavity. A memory material may be deposited in the cavity.

20 Claims, 16 Drawing Sheets

(56) References Cited

U.S. PATENT DOCUMENTS

| | | | |
|---|---|---|---|
| 2009/0090003 A1 | 4/2009 | En et al. | |
| 2010/0019221 A1* | 1/2010 | Lung | H10B 63/80 |
| | | | 438/102 |
| 2012/0235211 A1 | 9/2012 | Sills et al. | |
| 2013/0126816 A1* | 5/2013 | Tang | H10B 63/30 |
| | | | 438/618 |
| 2015/0280118 A1 | 10/2015 | Lee et al. | |
| 2019/0214560 A1* | 7/2019 | BrightSky | H10N 70/068 |

FOREIGN PATENT DOCUMENTS

| | | |
|---|---|---|
| KR | 10-2015-0090472 A | 8/2015 |
| KR | 10-2016-0076078 A | 6/2016 |
| WO | 2018/080615 A1 | 5/2018 |

OTHER PUBLICATIONS

International Search Report and Written Opinion received for PCT Patent Application No. PCT/US20/43053, mailed on Nov. 6, 2020, 10 pages.

\* cited by examiner

Section III-III

Section IV-IV

- First Conductive Material
- Electrode
- First Sacrificial Material
- First Mask Material
- Substrate

Section V-V

Section VI-VI

- First Conductive Material
- Electrode
- First Sacrificial Material
- First Mask Material
- Insulating Material Section VII-VII Section VIII-VIII

- First Conductive Material
- Electrode
- First Sacrificial Material
- Insulating Material

Section IX-IX

Section X-X

- First Conductive Material
- Electrode
- Insulating Material
- First Sacrificial Material
- Second Sacrificial Material
- Second Mask Material Section XVII-XVII Section XVIII-XVIII ☐ First Conductive Material
☐ Electrode
☐ Insulating Material
☐ Memory Material

| | First Conductive Material |
| | Electrode |
| | Insulating Material |
| | Memory Material |

First Conductive Material
Electrode
Insulating Material
Memory Material

Section XXIII-XXIII

Section XXIV-XXIV

- First Conductive Material
- Second Conductive Material
- Electrode
- Insulating Material
- Memory Material

TECHNIQUES FOR FORMING SELF-ALIGNED MEMORY STRUCTURES

CROSS REFERENCE

The present Application for Patent is a continuation of U.S. patent application Ser. No. 16/539,932 by Russell et al., entitled "TECHNIQUES FOR FORMING SELF-ALIGNED MEMORY STRUCTURES," filed Aug. 13, 2019, assigned to the assignee hereof, and is expressly incorporated by reference in its entirety herein.

BACKGROUND

The following relates generally to a system that includes at least one memory device and more specifically to techniques for forming self-aligned memory structures.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide memory technologies and others. Memory devices may be volatile or non-volatile. Improving memory devices, generally, may include increasing memory cell density, increasing read/write speeds, increasing reliability, increasing data retention, reducing power consumption, or improving manufacturing processes, among other metrics. Improves solutions for saving space in the memory array, increasing memory cell density, or manufacturing smaller memory cells for a memory array may be desired.

DETAILED DESCRIPTION

Figure 1:
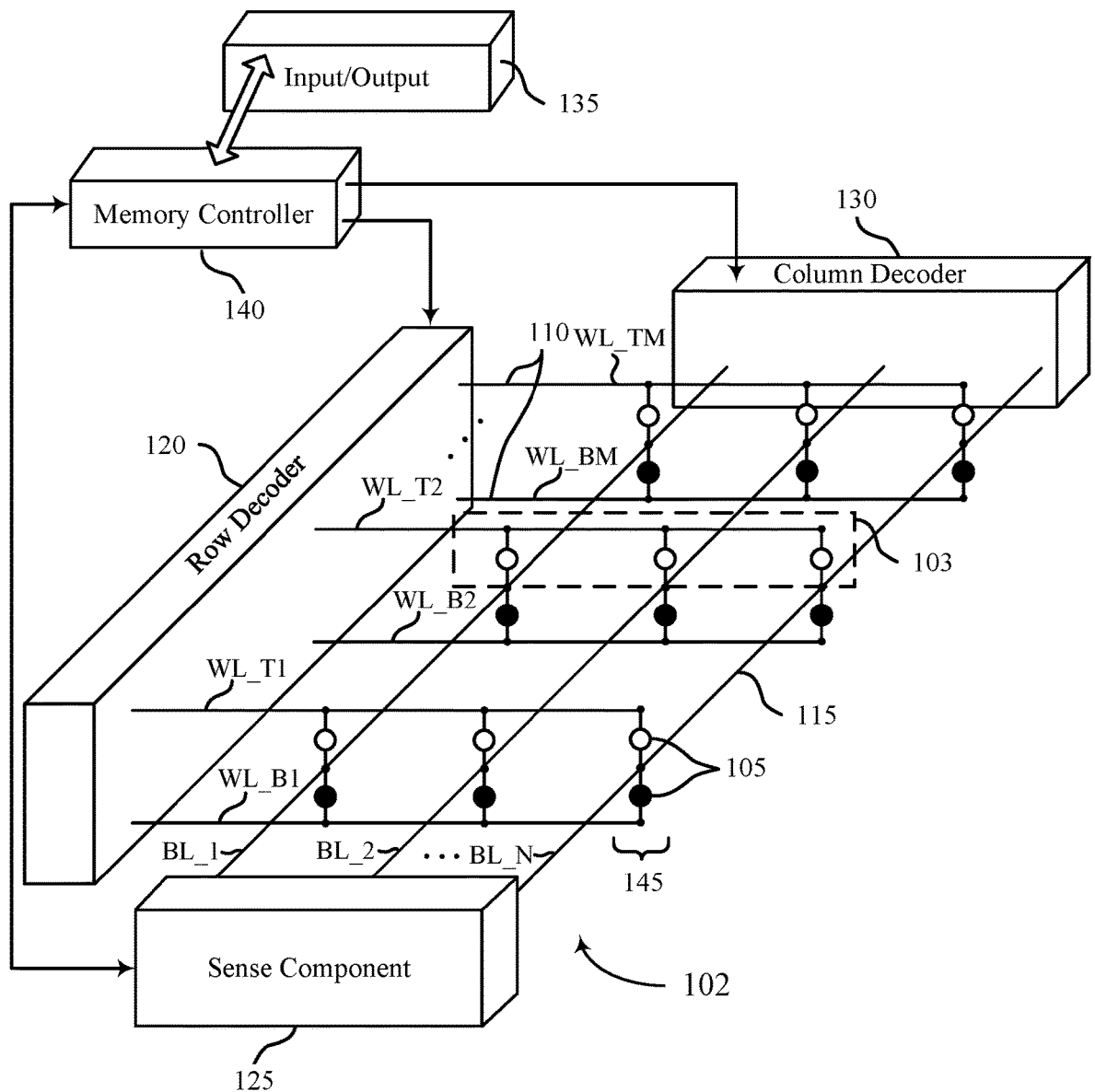
FIG. 1 illustrates an example of a memory device in accordance with examples as disclosed herein.

It may be desirable to form smaller memory cells, for example, to increase the storage density of a memory array, decrease power consumption per memory cell, decrease manufacturing costs, etc. However, process flows used in traditional manufacturing operations may not be able to reliably form memory cell features below a certain size. For example, etching a memory material to form smaller memory cells may include removing sections of the memory material that are closer together. As memory cell structures become smaller, secondary effects from manufacturing processes (e.g., etch damage, material contamination, etc.) may have a greater impact on the structure and function of the final memory cell. Additionally, manufacturing memory cells may including orienting a subsequent manufacturing process (e.g., a second etch process) in relation to a prior manufacturing process (e.g., a first etch process). As the memory cell size decreases, the manufacturing process may maintain greater tolerances between different operations. Accordingly, manufacturing processes that are used to produce larger memory cells may cause damage to smaller memory cells such as contamination or erosion, which prevent these processes from reliably forming memory cells at a smaller scale.

Processes for forming memory cells may include using a first masking pattern to remove material from a layered assembly of materials that includes a first sacrificial material and does not include a memory material. The voids left by removing material using the first masking pattern may be filled with insulating material to form a first portion of the memory cell structure. A second sacrificial material may be deposited onto the first portion of the memory cell structure and a second masking pattern may be used to remove portions of both the second sacrificial material and the first sacrificial material during the same operation. The voids left by removing the first sacrificial material and the second sacrificial material may be filled with insulating material that forms a second portion of the memory cell. Accordingly, removing both first and second sacrificial materials in a single operation aligns features of the second portion of the memory cell structure with the features of the first portion of the memory cell structure. Remaining portions of both the first and second sacrificial materials may be removed to form a memory cavity.

After the insulating material has been formed and remaining portions of the sacrificial materials are removed, memory material may be deposited into the cavities defined by the insulating material. In some cases, excess memory material may be removed and a second or top conductor may be deposited onto the memory material. A bottom conductor may contact a first group of memory cells along a first direction and a top conductor may contact a second group of memory cells along a second direction. The top conductor may partially fill the void created above the memory cavity by removing the first and second sacrificial materials. Accordingly, the manufacturing process may self-align the memory material with structures such as the first/bottom conductor and the second/top conductor by using an operation that remove portions of both a first and second sacrificial materials in the same process step.

Features of the disclosure are initially described in the context of memory devices as described with reference to FIGS. 1-2. Features of the disclosure are described in the context a manufacturing process as described with reference to FIGS. 3-14. These and other features of the disclosure are further illustrated by and described with reference to flowcharts that relate to techniques for forming self-aligned memory structures as described with references to FIGS. 15-16.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a three-dimensional (3D) memory array 102. The memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays 103 formed on top of one another. This may increase a quantity of memory cells that may be placed or created on a single die or substrate as compared with 2D arrays, which in turn may reduce production costs, or increase the performance of the memory device, or both. The memory array 102 may include two levels of memory cells 105 and may thus be considered a memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing a word line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized (may have a voltage potential or current flow) to read or write a memory cell 105 at their intersection. Other memory cells 105 that are in electronic communication with (e.g., connected to) the same access line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different materials.

Operations such as reading and writing may be performed on memory cells 105 by activating or selecting access line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors (e.g., polysilicon), or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled BL_1 through BL_N, where M and N depend on the array size. Thus, by activating a word line 110 and a bit line 115, e.g., WL_2 and BL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the memory cell for achieving the results described herein. This example of a mechanism should not be considered limiting. This disclosure also includes other examples of mechanisms of the memory cell for achieving the results described herein.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component may be associated either with column decoder or row decoder.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying a first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with a word line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may be configured to store a logic state in the memory cell 105 based on applying the first voltage to the memory cell 105. Although discussed as applied by using a first voltage and a second voltage, it should be understood that current may be applied between the first conductive line and second conductive line to perform the access, operation, in some cases.

Figure 2:
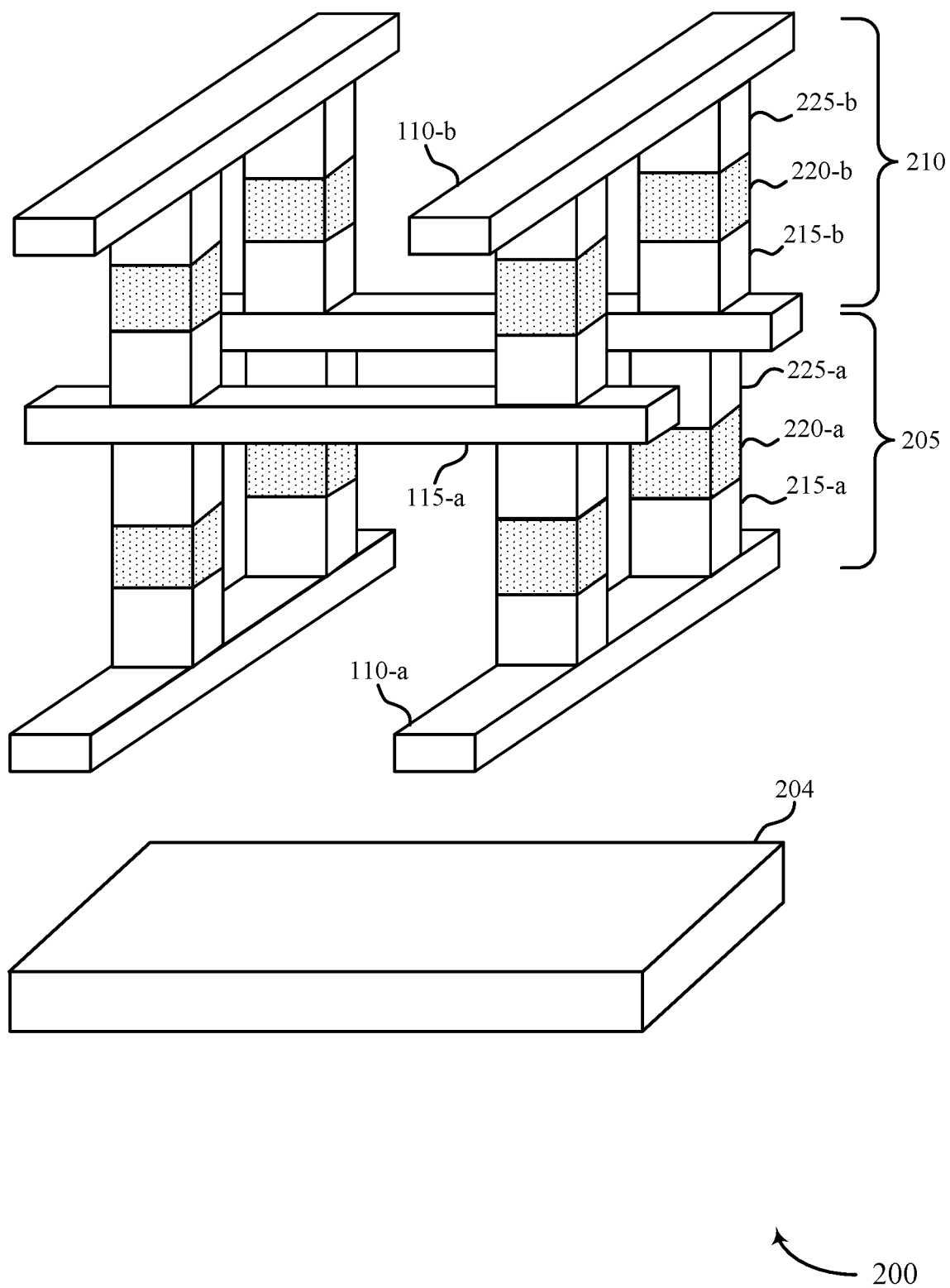
FIG. 2 illustrates an example of a memory array that supports a memory device in accordance with examples as disclosed herein.

FIG. 2 illustrates an example of a memory array that supports a memory device 200 in accordance with examples as disclosed herein. Memory device 200 may be an example of portions of memory array 102 described with reference to FIG. 1. Memory device 200 may include a first array or deck 205 of memory cells that is positioned above a substrate 204 and second array or deck 210 of memory cells on top of the first array or deck 205. Memory device 200 may also include word line 110-a and word line 110-b, and bit line 115-a, which may be examples of word line 110 and bit line 115, as described with reference to FIG. 1. Memory cells of the first deck 205 and the second deck 210 each may have one or more memory cell (e.g., memory cell 220-a and memory cell 220-b, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-a, memory cell 220-a (e.g., including chalcogenide material), and second electrode 225-a. In addition, memory cells of the second deck 210 may include a first electrode 215-b, memory cell 220-b (e.g., including chalcogenide material), and second electrode 225-b. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-a such that bit line 115-a is shared by vertically adjacent memory cells. In accordance with the teachings herein, a decoder may be positioned above or below each deck if the memory device 200 includes more than one deck. For example, a decoder may be positioned above first deck 205 and above second deck 210. In some cases, the memory cells 220 may be examples of phase-change memory cells or self-selecting memory cells.

The architecture of memory device 200 may be referred to as a cross-point architecture, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (CO, or fluorine (F), each in atomic or molecular forms.

In some examples, a memory cell 220 including chalcogenide material may be programmed to a logic state by applying a first voltage or a first current. By way of example, when a particular memory cell 220 is programed, elements within the cell may separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

For example, if a memory cell has a given distribution of ions, the threshold voltage detected during the read operation may be different for a first read voltage with a first polarity than it is with a second read voltage having a second polarity. Depending on the polarity of the memory cell, this concentration of migrating ions may represent a logic "1" or logic "0" state. This description of ion migration represents an example of a mechanism of the memory cell for achieving the results described herein. This example of a mechanism should not be considered limiting. This disclosure is also applicable to other examples of mechanisms of the memory cell for achieving the results described herein.

In some cases, a first voltage may be applied to a first conductive line of a decoder as part of an access operation of the memory cell 220. Upon applying the first voltage, the first conductive line may be coupled with the access line (e.g., word line 110-a, word line 110-b, or bit line 115-a) associated with the memory cell 220. For example, the first conductive line may be coupled with the access line based on a doped material of the decoder which extends between the first conductive line and the access line in a first direction.

In some examples, the first voltage may be applied to the memory cell 220 based on coupling the first conductive line of the decoder with the access line. The decoder may include one or more doped materials that extend between the first conductive line and the access line of the memory device 200 of memory cells in a first direction away from a surface of the substrate 204. In some cases, the decoder may be coupled with the substrate 204.

FIGS. 3-15 illustrate a manufacturing process that includes performing a series of operations on a layered assembly of materials to form one or more memory cells of a memory array. These figures illustrate examples of intermediate structures that may be formed by performing operations of the manufacturing process on a layered assembly of materials. The structures illustrated in FIGS. 3-15 provide an example of a sequence of operations for the manufacturing process. In other cases, the manufacturing process may include combining various operations, altering the sequence of operations, eliminating one or more operations or steps of these operations, or any combination thereof.

Figure 3:
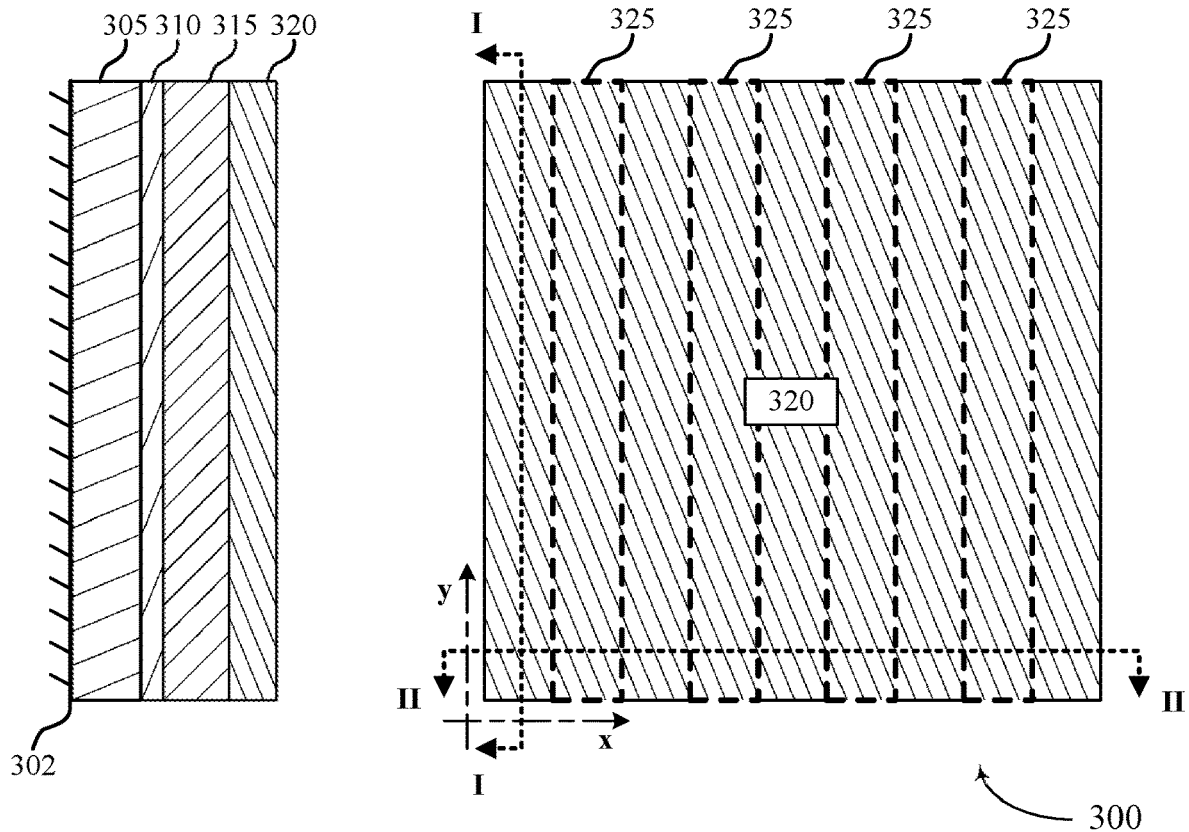
FIGS. 3-14 illustrate example operations performed as part of a manufacturing process that support techniques for forming self-aligned memory structures in accordance with examples as disclosed herein.
Figure 3:
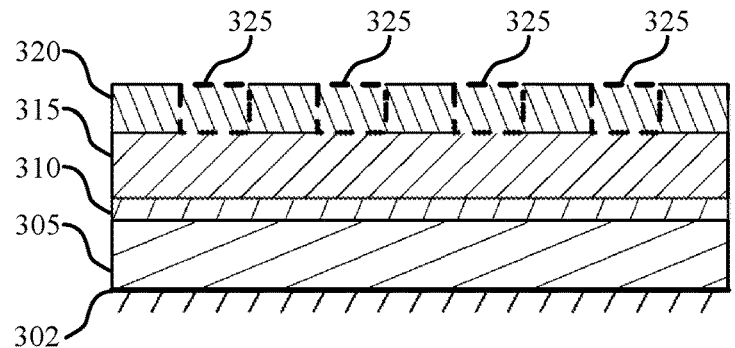

FIG. 3 illustrates top and cross-sectional views of a layered assembly of materials 300 that supports techniques for forming self-aligned memory structures in accordance with examples as disclosed herein. The layered assembly of materials 300 may include a substrate 302, which may be an example of substrate 204 described with reference to FIG. 2, a first conductive material 305, an electrode 310, a first sacrificial material 315 and a first mask material 320. The layered assembly of materials 300 may undergo one or more manufacturing processes to form memory cells of a memory array, such as memory array 102 and memory device 200 described with reference to FIGS. 1 and 2.

The layered assembly of materials 300 may include a layer of conductive material 305 deposited onto or coupled with the substrate 302. The layer of conductive material 305 may undergo one or more manufacturing processes to form conductive lines of a memory array. For example, the layer of conductive material 305 may be etched to form word lines for one or more memory cells, such as word lines 110 described with reference to FIGS. 1 and 2. In some cases, the conductive material 305 may form a single continuous layer of the layered assembly of materials 300 and one or more manufacturing processes (e.g., etching) may be performed to form the layer of conductive material 305 into multiple discrete structures of a memory array (e.g., series of parallel word lines). In other examples, the conductive material 305 may be deposited or formed on the substrate 302 in a pattern to form one or more structures (e.g., conductive lines/paths) within the layered assembly of materials 300.

The layered assembly of materials 300 may include an electrode 310 coupled with the conductive material 305. The electrode 310 may form a layer of material coupled with a surface, such as the top surface, of the conductive material 305. The electrode 310 may be an example of electrodes 215 or 225 described with reference to FIG. 2. The electrode 310 may form a first contact with a memory material or memory cell of the memory array. In some cases, the electrode 310 layer may form a single continuous layer of material over the conductive material 305. In other cases, the electrode 310 may be deposited or formed on the conductive material 305 in a pattern to form one or more structures (e.g., electrode contacts) within the layered assembly of materials 300. In some cases, a pattern of the electrode 310 may match or correspond to a pattern of the conductive material 305.

The layered assembly of materials 300 may include a layer of first sacrificial material 315 deposited onto or coupled with the electrode 310. The first sacrificial material 315 may be used during one or more manufacturing steps for forming one or more structures of the array. In some cases, one or more portions of the first sacrificial material 315 may be removed at different steps in the manufacturing process. For example, in a first operation a first portion of the first sacrificial material 315 may be etched away to form cavities that are filled with insulative material and in a second operation a second portion of the first sacrificial material may be removed exposing a cavity that is filled with a memory material that forms a memory cell (e.g., memory cells 105 and 220 as described with reference to FIGS. 1 and 2).

A first mask material 320 may form a top surface of the layered assembly of materials 300. In some cases, the first mask material 320 may be applied to or formed over the sacrificial material 315 according to a first pattern. For example, the first mask material 320 may be include a hard mask and be patterned using a photolithography process. In some cases, photoresists may be used alone as the first mask material 320 or to pattern a hard mask material. Patterning of the first mask material 320 may include removing or defined portions from the first mask material. For example, a photolithography process may be used to form a first mask pattern that has pattern segments 325 for forming a first set of channels along a first direction (e.g., y-axis) in the layered assembly of materials.

The sacrificial material 315 may be chosen based on its interaction to one or more manufacturing processes. For example, the sacrificial material 315 may be a material that maintains desired dimensional tolerances or behaves predictably and repeatably to specific processes operations (e.g., etch, photolithography, etc.). That is, in cases where a stack of material includes a memory material instead of the sacrificial material 315, an etch process may degrade, damage or change the structure (e.g., surface chemistry) of the memory material. As the size of memory cells shrink, these manufacturing induced defects may limit the minimum size of a memory cell. For example, as memory cells get smaller the manufacturing induced defects may comprise a larger percentage of the total memory cell size and may result in memory cells that cannot reliably store data, for example, within one or more specifications (e.g., time, temperature). However, using the sacrificial material 315 may reduce contamination, degradation or changes in surface chemistry of a memory material. For example, using a sacrificial material may allow a memory material to be deposited onto the stack of material after one or more manufacturing operations are performed using the sacrificial material. Further, because the sacrificial material will be removed, and is not used to store or read memory states, the sacrificial material 315 may be chosen to provide manufacturing advantages such as greater dimensional stability during one or more manufacturing operations (e.g., etching or depositing insulative material as described herein). In some cases, the sacrificial material may include a silicon nitride material.

The layered assembly of materials 300 may be used to form multiple memory cells of a memory array. In some cases, for example in 3D memory structures, a first set/layer of memory cells may be formed from a first layered assembly of material 300 and a second set/layer of memory cells may be formed on top of the first set/layer by depositing a second layered assembly of materials 300 onto the first set of memory cells. In some cases, a second or subsequent layer of memory cells may be formed by depositing a second layered assembly of material 300 in a different direction than a first layered assembly of material 300. For example, the second layered assembly of materials 300 may be deposited or formed at an orthogonal orientation to the first layered assembly of materials 300. In some cases, a second or subsequent layered assembly of materials 300 may have fewer or different layers, materials or material compositions as compared to the first layered assembly of materials 300. For example, a second layered assembly of material 300 may not include the substrate 302, have a different conductive material 305, different electrode 310, different sacrificial material 315, different ordering of the layers (e.g., electrode 310 below the conductive material 305), or any combination thereof.

Figure 4:
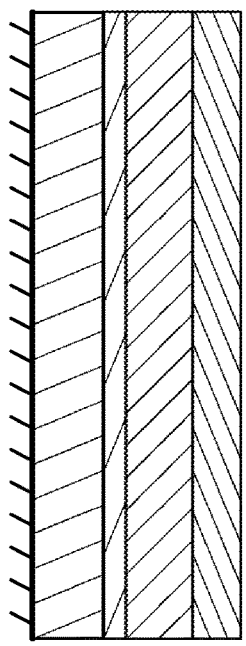
Figure 4:
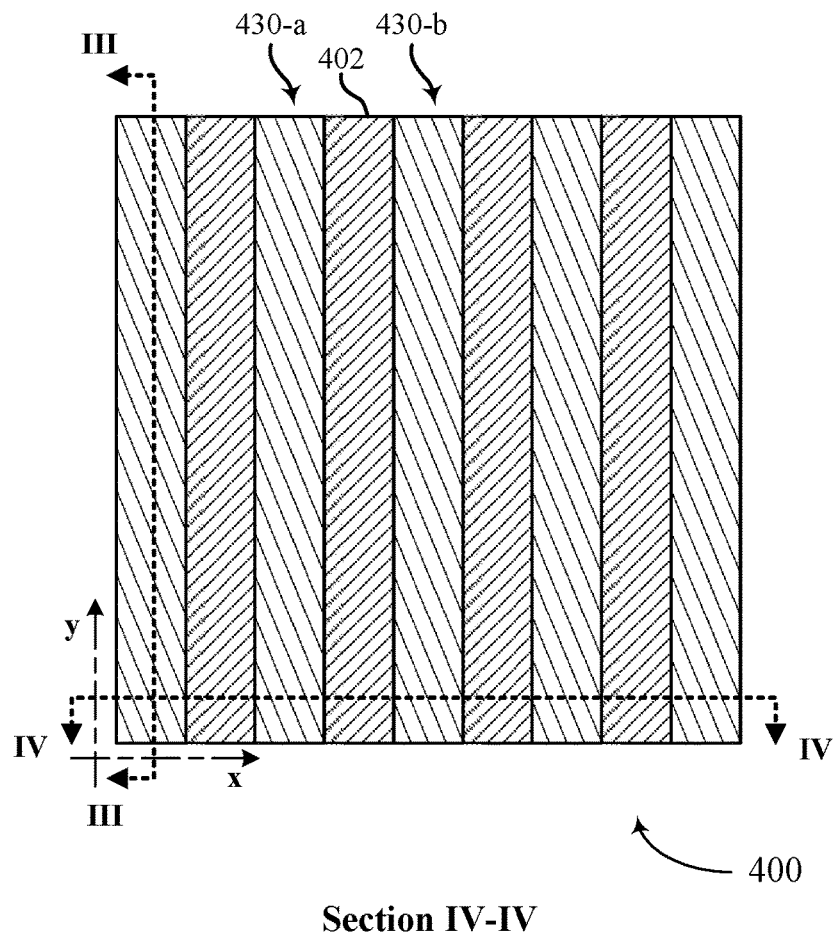
Figure 4:
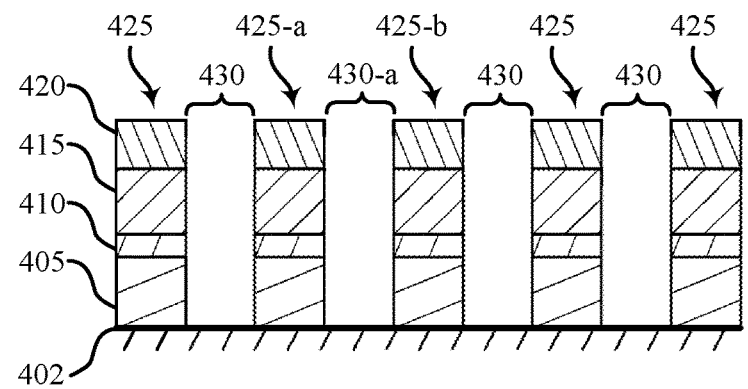

FIG. 4 illustrates top and cross-sectional views of an example of a first structure 400 formed by a material removal operation as part of a manufacturing process for forming self-aligned memory structures in accordance with examples as disclosed herein. The material removal operation may be performed on the layered assembly of materials 300 to form the first structure 400, and after performing the material removal operation on the layered assembly of materials 300, the first structure 400 may include multiple first sections 425 forming one or more first channels 430.

The material removal operation may include etching the layered assembly of materials 300 to remove defined portions that create first sections 425 and first channels 430. The operation may include using a patterned mask (e.g., hard mask, photoresist, etc. described with reference to FIG. 3) to etch the first channels 430. Each first channel 430 may be defined by or bounded by two of the first sections 425. For example, first channel 430-a may be formed by etching away a portion of the layered assembly of materials 300, and have first section 425-a forming a first side of the channel and first section 425-b forming a second side of the channel.

The etching operation may form multiple first sections 425 and multiple first channels 430. Each first section 425 may include a portion of the layered assembly of materials. For example, each first section 425 may include a first conductive material 405, an electrode 410, a first sacrificial material 415 and a first mask material 420, which may be examples of the first conductive material 305, the electrode 410, the first sacrificial material 315 and the first mask material described in relation to FIG. 3. The first sections 425 may create a repeating pattern of first channels 430 across the array. In some cases, each first section 425 and each first channel 430 may extend in a first direction (along the y-axis).

Figure 5:
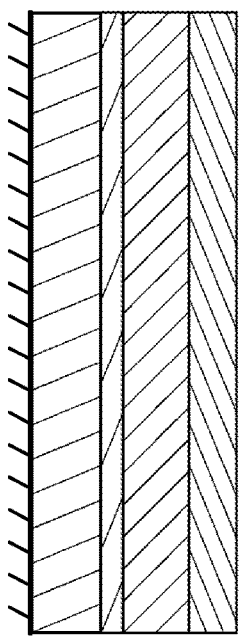
Figure 5:
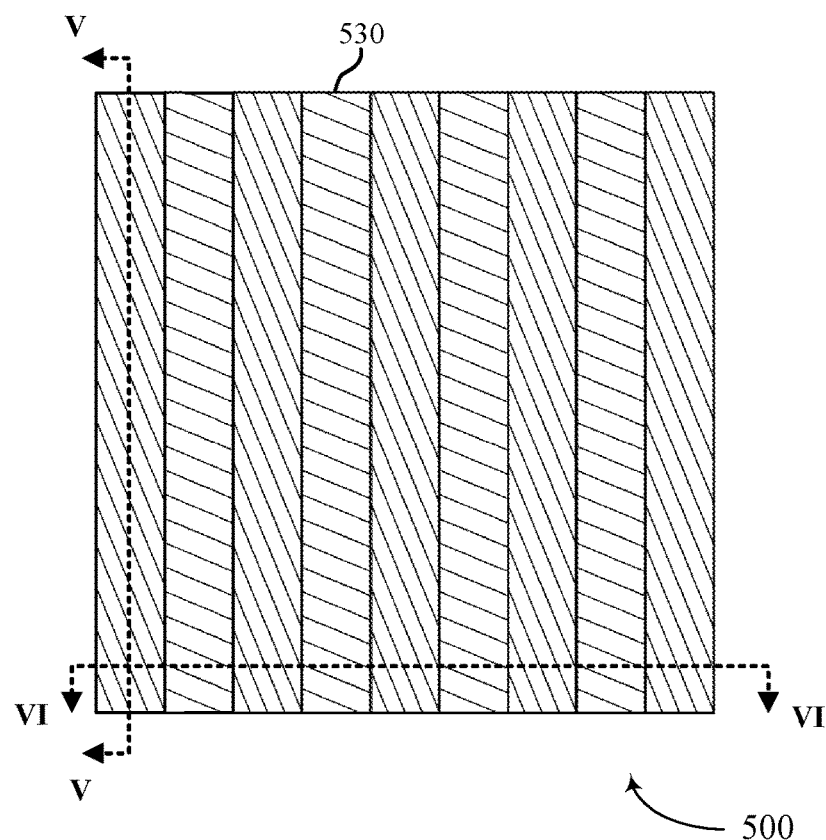
Figure 5:
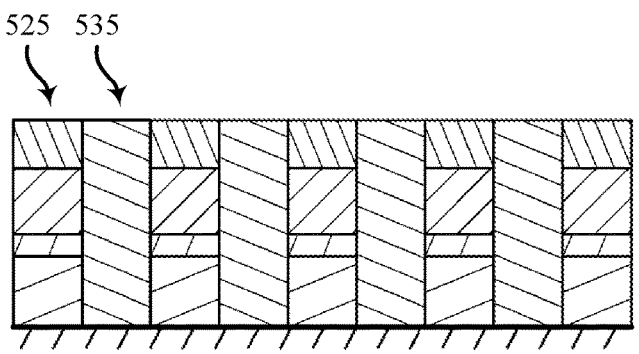

FIG. 5 illustrates top and cross-sectional views of an example of a second structure 500 formed by a material addition operation as part of a manufacturing process for forming self-aligned memory structures in accordance with examples as disclosed herein. The material addition operation may be performed on the first structure 400 to form the second structure 500, and after performing the material addition operation on the first structure 400, the second structure 500 may include multiple first sections 525 of the layered assembly of materials 300, which may be examples of first sections 425 described with reference to FIG. 4. The second structure may also include insulating material 530 forming multiple first insulative sections 535.

The material addition operation may include depositing an insulating material 530 into the first channels 430 formed by the previous etching operation. In some cases, the deposition operation may fill the first channels 430 with the insulating material 530 and excess insulating material 530 may cover a top surface of the first structure 400. A planarization procedure may be performed after depositing the insulating material 530 to expose a top surface of the first sections 525. As a result, the second structure 500 may include an alternating sequence of first sections 525 and first insulative sections 535. In some examples, the planarization process may create a substantial flat top surface on the second structure 500, including an alternating sequence of a first mask material and the insulating material 530. The insulating material 530 may be, for example silicon dioxide.

Figure 6:
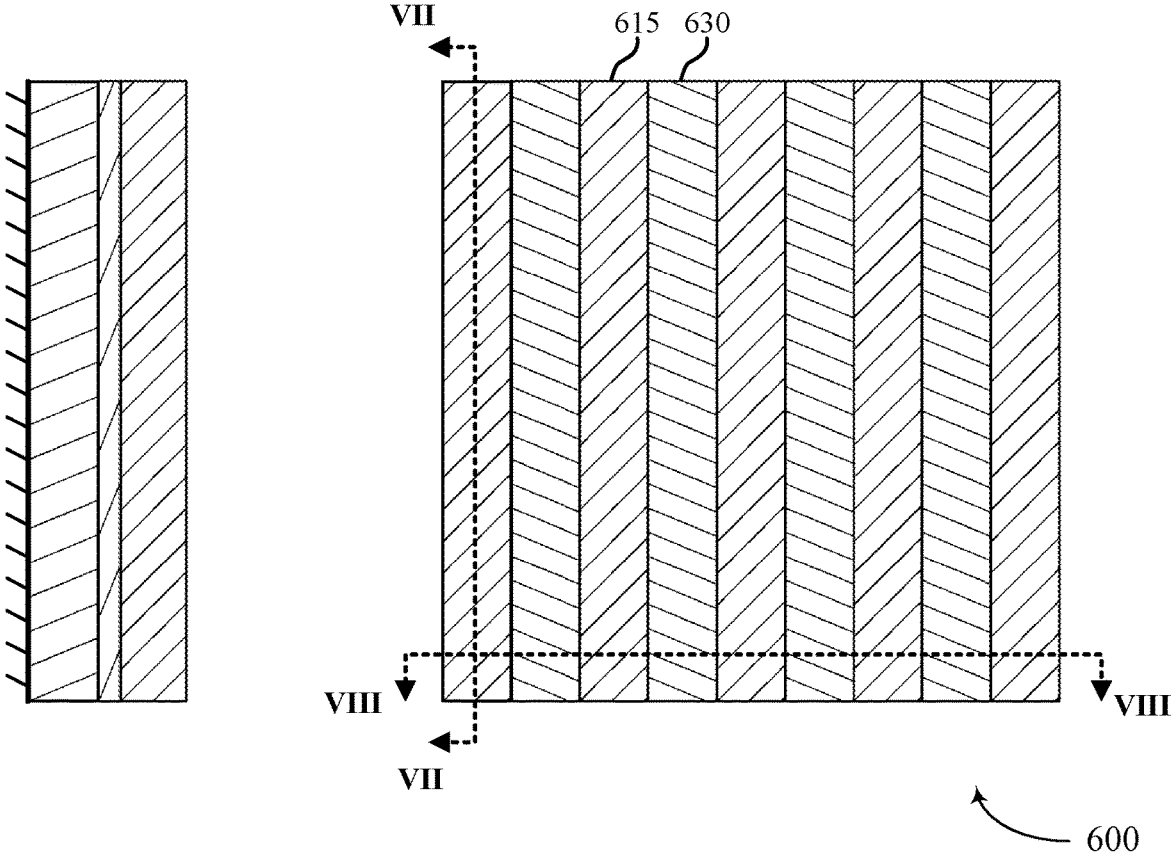
Figure 6:
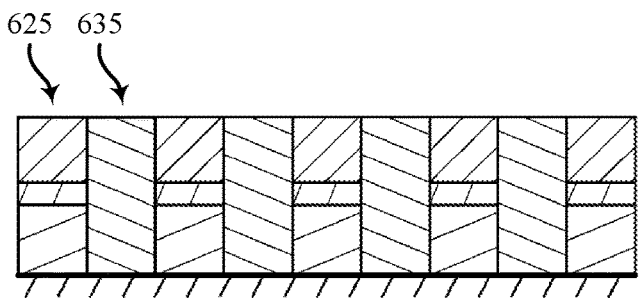

FIG. 6 illustrates top and cross-sectional views of an example of a third structure 600 formed by a mask removal operation as part of a manufacturing process for forming self-aligned memory structures in accordance with examples as disclosed herein. The mask removal operation may be performed on the second structure 500 to form the third structure 600, and after performing the mask removal operation on the second structure 500, the third structure 600 may include multiple first sections 625 that include a first sacrificial material 615 as a top layer. The first sacrificial material may be an example of the first sacrificial materials 315, 415 described in relation to FIGS. 3-4. The second structure may also include insulating material 630 forming multiple first insulative sections 635, which may be examples of insulating material 530 and insulative sections 535 described with reference to FIG. 5.

The mask removal operation may include exposing a top surface of the first sacrificial material 615 and the third structure 600 may include an alternating sequence of first sections 625 and first insulative sections 635. Accordingly, the top surface of the third structure 600 may include alternating sections of the first sacrificial material 615 and the insulating material 630. In some examples, the mask removal process may be performed to produce a substantially flat top surface. For example, the mask removal process may include chemical mechanical planarization.

Figure 7:
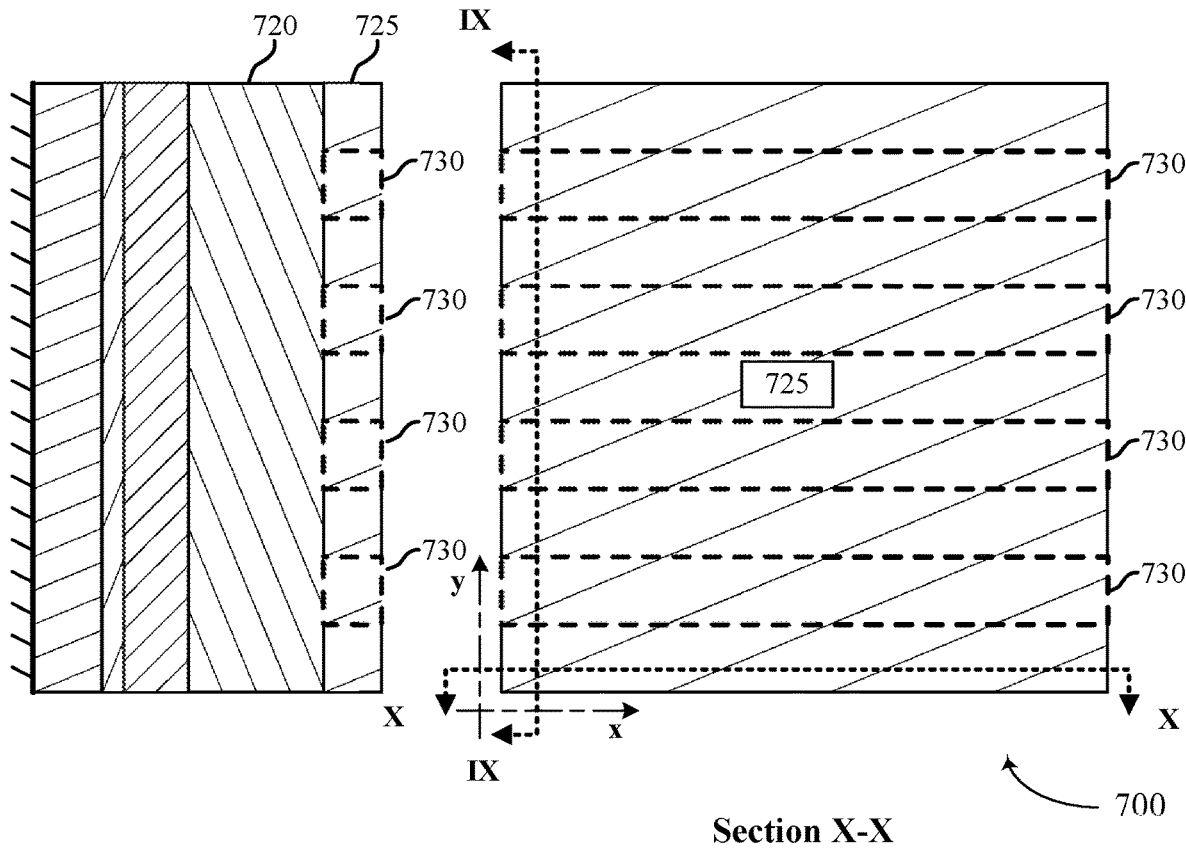
Figure 7:
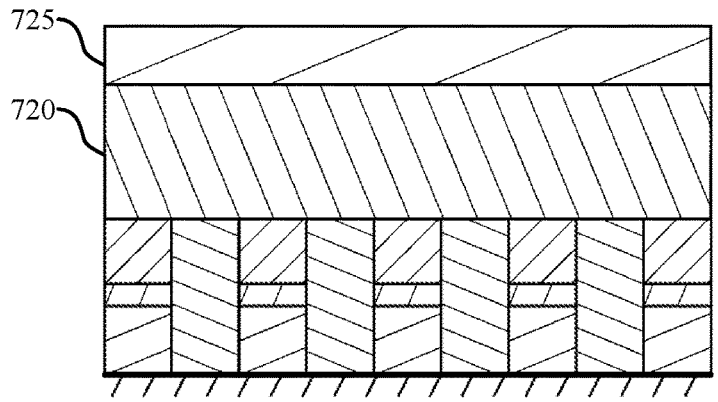

FIG. 7 illustrates top and cross-sectional views of an example of a fourth structure 700 formed by a material addition operation as part of a manufacturing process for forming self-aligned memory structures in accordance with examples as disclosed herein. The material addition operation may be performed on the third structure 600 to form the fourth structure 700, and after performing the material addition operation on the third structure 600, the fourth structure 700 may include a layer of a second sacrificial material 720 and a layer of second mask material 725. The second sacrificial material 720 may be deposited onto the top surface of the third structure 600 and the second mask material 725 may be deposited onto a top surface of the second sacrificial material 720.

The fourth structure 700 may include a layer of second sacrificial material 720 deposited onto or coupled with the top surface of the third structure 600 (e.g., first sacrificial material 615 and insulating material 630). The second sacrificial material 720 may be used during one or more manufacturing steps for forming one or more structures of the array. In some cases, one or more portions of the second sacrificial material 720 may be removed at different steps in the manufacturing process. For example, in a subsequent operation a first portion of the second sacrificial material 720 may be etched away to form cavities that are filled with insulative material. In some cases, a second subsequent operation may be performed to remove a second portion of the second sacrificial material 720 to expose/create a cavity that is filled with a memory material and forms a memory cell (e.g., memory cells 105 and 220 as described with reference to FIGS. 1 and 2).

A second mask material 725 may form a top surface of the fourth structure 700. In some cases, the second mask material 725 may be applied to or formed over the second sacrificial material 720 according to a second pattern. For example, the second mask material 725 may include a hard mask and be patterned using a photolithography process. In some cases, a photoresist may be used as the second mask material 725 or to pattern a hard mask material. Patterning of the second mask material 725 may include removing defined portions from the second mask material 725. For example, a photolithography process may be used to form a second mask pattern that has second pattern segments 730 for forming a second set of channels along a second direction (e.g., x-axis) in the fourth structure 700. The second pattern segments 730 may be oriented in a second direction that is a different orientation as compared to the first direction discussed herein. For example, the second pattern segments 730 may be oriented at an orthogonal relationship to the first pattern segments 325, described with relation to FIG. 3.

Figure 8:
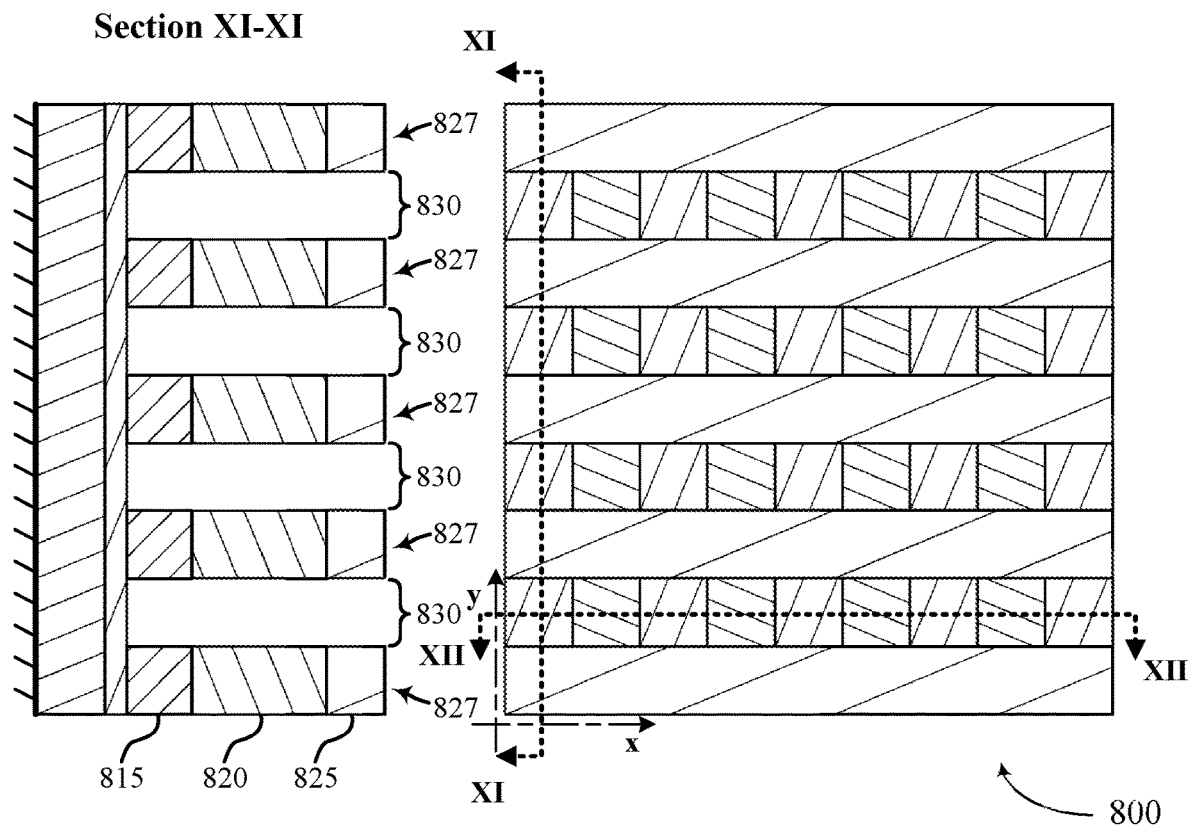
Figure 8:
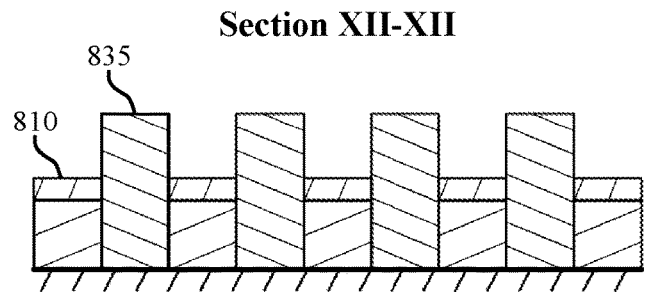

FIG. 8 illustrates top and cross-sectional views of an example of a fifth structure 800 formed by a material removal operation as part of a manufacturing process for forming self-aligned memory structures in accordance with examples as disclosed herein. The fifth structure may include an electrode material 810, a first sacrificial material 815, a second sacrificial material 820 and a second mask material 825, which may be examples of the electrode, the first sacrificial material, the second sacrificial material, and mask material described herein. The material removal operation may be performed on the fourth structure 700 to form the fifth structure 800, and after performing the material removal operation on the fourth structure 700, the fifth structure 800 may include multiple second sections 827 forming one or more second channels 830.

The material removal operation may include etching through portions of the second sacrificial material 820 and the first sacrificial material 815 of the fourth structure 700 to create second channels 830. The operation may include using a second mask pattern (e.g., hard mask, photoresist, etc.) oriented in the second direction to form the second channels 830. Accordingly, the second channels 830 may be oriented in a different direction as compared to the first channels 430. By etching the second channels 830 through both the first sacrificial material 815 and the second sacrificial material 820, the second channels 830 may self-align with features formed in the prior manufacturing operations described herein. For example, the second channels 830 may automatically align cavities for the memory material with the bottom electrode 810.

The etching operation may form multiple second sections 827 and multiple second channels 830. Each second section 827 may include a portion of the fourth structure 700. For example, each second section 827 may include a layer of first sacrificial material 815, a layer of second sacrificial material 820, and a layer of a second mask material 825, which may be examples of the first sacrificial material, second sacrificial material, and second mask material described herein. The second sections 827 may create a repeating pattern of second channels 830 across the fifth structure 800. In some cases, each second section 827 and each second channel 830 may extend in the second direction (e.g., along or parallel to the x-axis).

Section view XII-XII illustrates an example of the structures forming a bottom surface of each second channel 830. For example, the bottom surface of the second channel 830 may include an alternating sequence of electrode sections 810 and first insulating material sections 835. In some cases, the insulating material sections 835 may be taller or extend higher than the electrode sections 810. Additionally or alternatively, both the electrode sections 810 and the insulating material sections 835 may extend across the array in the first direction (along or parallel to the y-axis).

Figure 9:
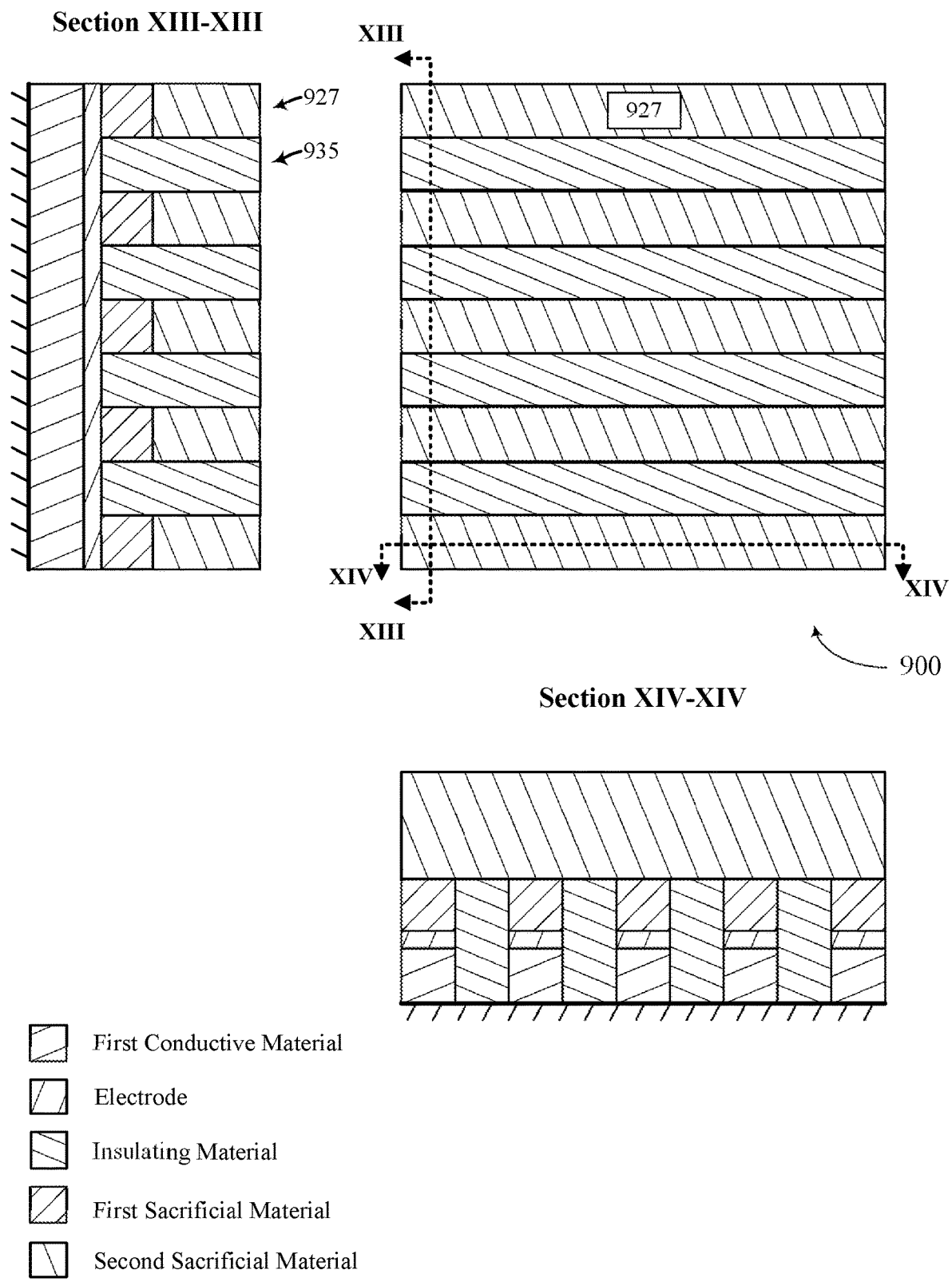

FIG. 9 illustrates top and cross-sectional views of an example of a sixth structure 900 formed by a material addition operation as part of a manufacturing process for forming self-aligned memory structures in accordance with examples as disclosed herein. The material addition operation may be performed on the fifth structure 800 to form the sixth structure 900, and after performing the material addition operation on the fifth structure 800, the sixth structure 900 may include multiple second sections 927 and multiple second insulative sections 935.

The material addition operation may include depositing an insulating material into the second channels 830 formed in the fifth structure 800 by the previous etching operation. In some cases, the deposition operation may fill the second channels 830 with the insulating material and excess insulating material may cover a top surface of the fifth structure 800. A planarization procedure (e.g., chemical mechanical planarization) may be performed after depositing the insulating material to expose a top surface of the second sections 927. As a result, the sixth structure 900 may include an alternating sequence of second sections 927 and second insulative sections 935. In some examples, the planarization process may remove the second mask material and create a substantial flat top surface on the sixth structure 900, which may include an alternating sequence of a second sacrificial material and the insulating material.

Figure 10:
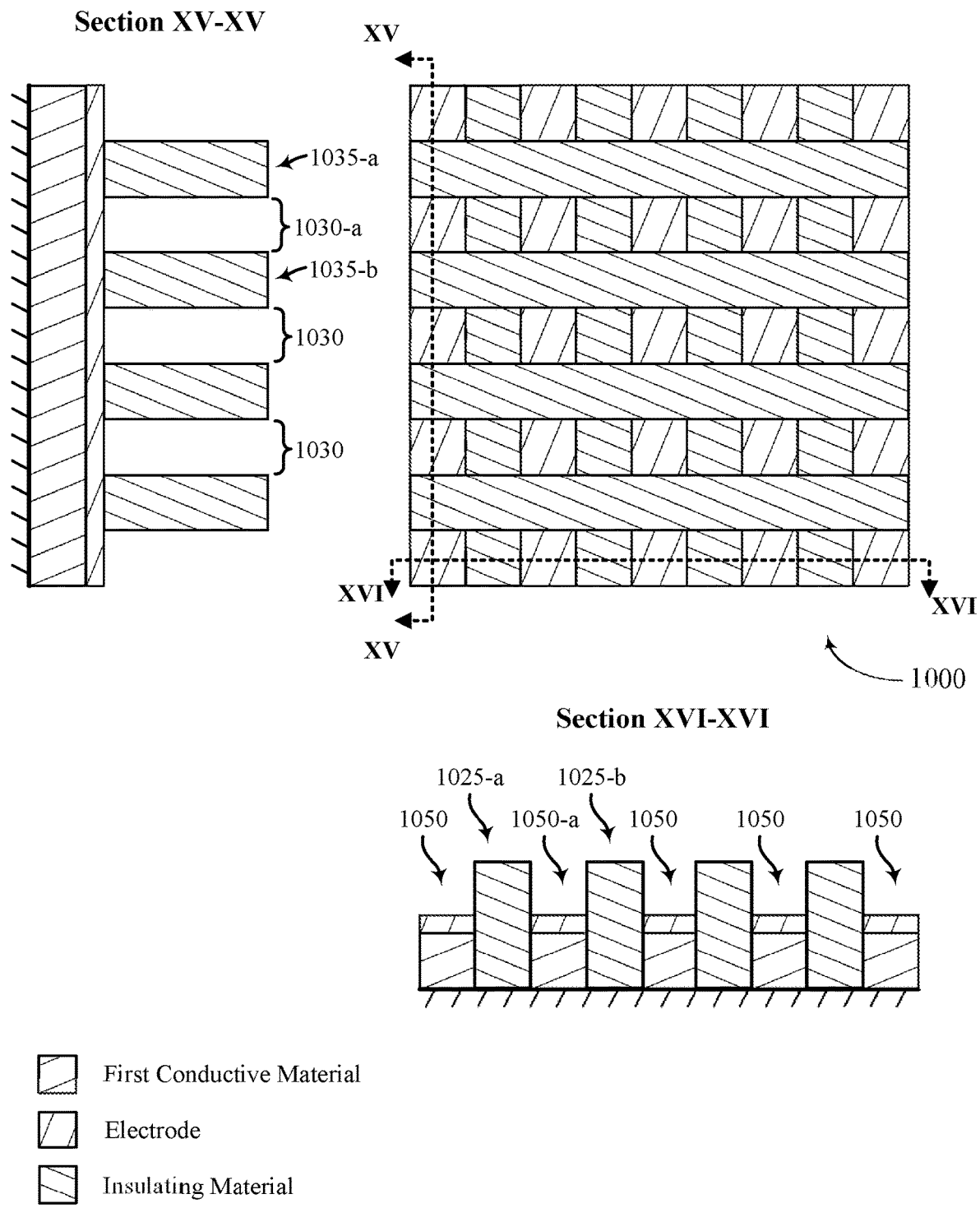

FIG. 10 illustrates top and cross-sectional views of an example of a seventh structure 1000 formed by a sacrificial material removal operation as part of a manufacturing process for forming self-aligned memory structures in accordance with examples as disclosed herein. The sacrificial material removal operation may be performed on the sixth structure 900 to form the seventh structure 1000, and after performing the sacrificial material removal operation on the sixth structure 900, the seventh structure 1000 may include multiple second insulative sections 1035 and multiple third channels 1030 each having multiple memory cavities 1050.

Removing the first and second sacrificial materials from the sixth structure may form/expose third channels 1030, which may extend along the second direction. As shown in section view XV-XV, each third channel 1030 may be formed between two second insulative sections 1035. For example, third channel 1030-a may be formed by second insulative section 1035-a on one side and second insulative section 1035-b on the other side. A bottom of each third channel 1030 may include both electrode sections and first insulative sections. In each third channel 1030, memory cavities 1050 may be formed between first insulative sections 1025. For example, as shown in section view XVI-XVI, a first memory cavity 1050-a may be formed between two first insulative sections 1025-a, 1025-b. In some cases, an electrode may form a bottom surface of the memory cavity 1050. Accordingly, each memory cavity 1050 may be formed between first insulative sections 1025 and second insulative sections 1035. Further, the first insulative sections 1025 and the second insulative sections 1035 may have different heights. For example, the final memory array, may include memory material that is filled to the height of the first insulative sections 1025. Thereby, a portion of the third channel 1030 above the memory cavities 1050 may include a top electrode that extends along the second direction (e.g., orthogonal to the direction of the bottom electrode of the layered assembly of materials 300).

Figure 11:
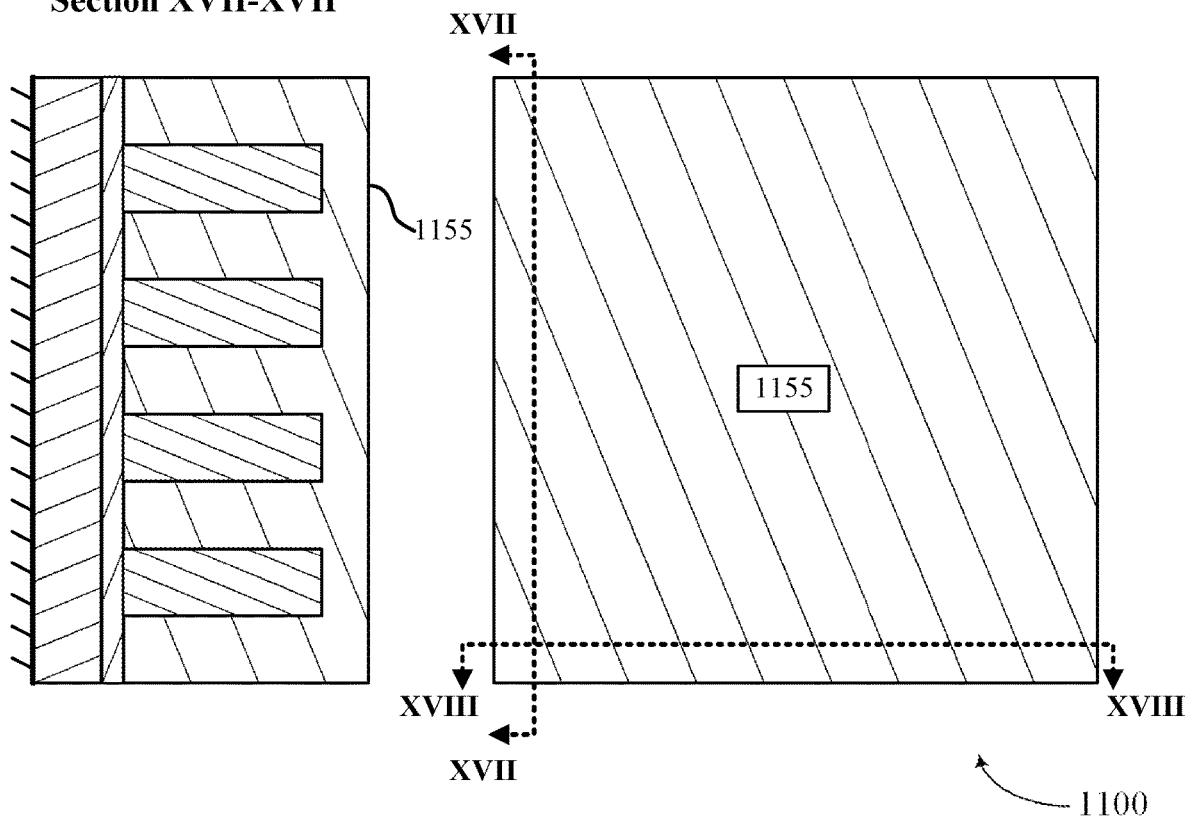
Figure 11:
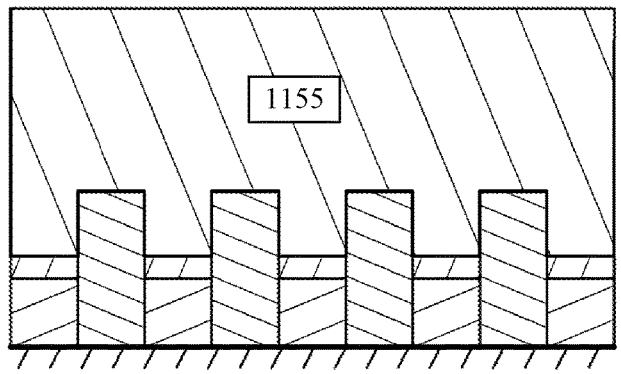

FIG. 11 illustrates top and cross-sectional views of an example of an eighth structure 1100 formed by memory material depositing operation as part of a manufacturing process for forming self-aligned memory structures in accordance with examples as disclosed herein. The memory material depositing operation may be performed on the seventh structure 1000 to form the eighth structure 1100, and after performing the memory material depositing operation on the seventh structure 1000, the eighth structure 1100 may include memory material 1155 filling each memory cavity 1050 (FIG. 10), and in some cases, at least a portion of the third channels 1030 (FIG. 10).

The memory material deposition operation may include depositing a chalcogenide memory material onto the seventh structure 1000. In some cases, the memory material may fill the third channels 1030 (FIG. 10) and cover a top surface of the second insulative sections 1035 (FIG. 10). An etch or selective etch procedure may be performed to remove excess memory material from the eighth structure 1100. In other examples, a selective memory material deposition procedure may be performed, such that the memory material fills the memory cavities 1050 (FIG. 10) to a height of the first insulative sections 1025 (FIG. 10). In some cases, a selective deposition procedure may not include a subsequent etch procedure to remove excess memory material. In other cases, an etch procedure, a polishing procedure or a combination thereof may be performed to remove excess material or create desired surface properties of the memory material. They etch and/or polishing procedures may be performed on the selectively deposited memory material, to remove excess material from the eighth structure, or a combination thereof.

Figure 12:
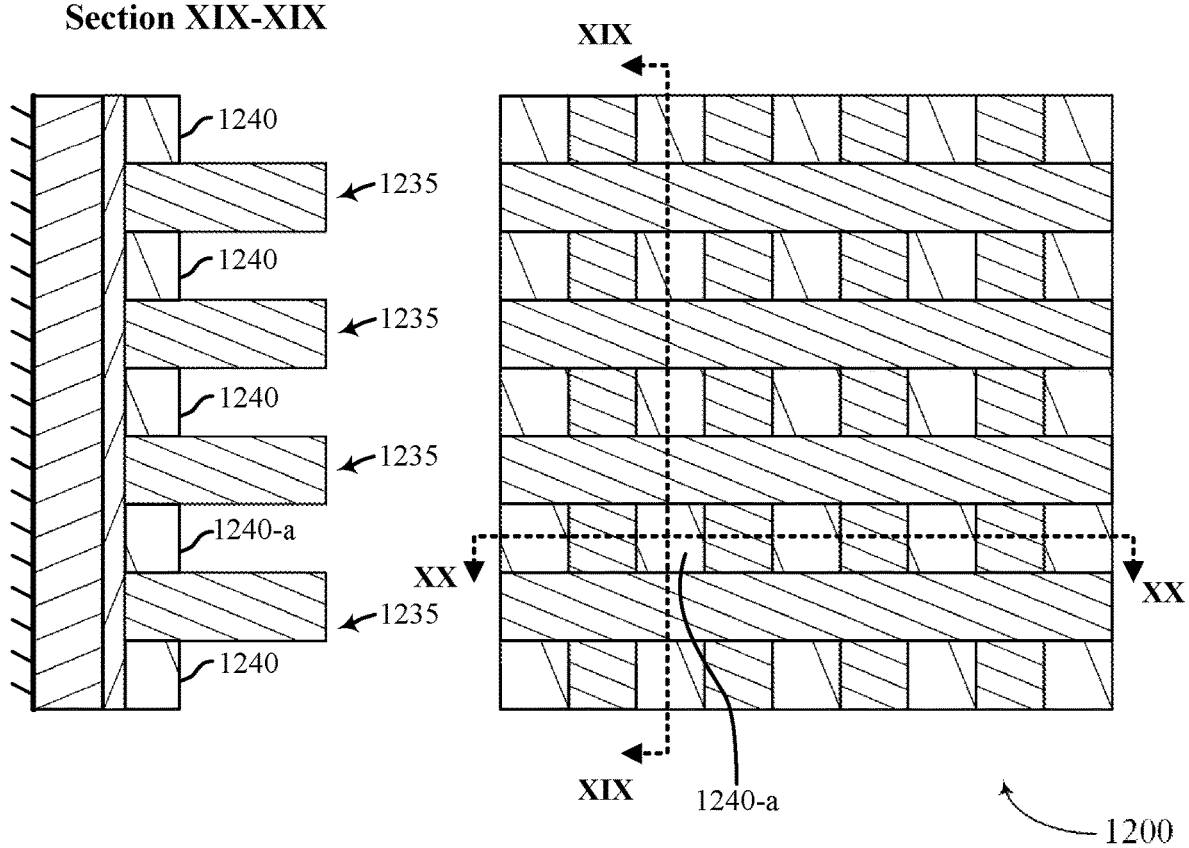
Figure 12:
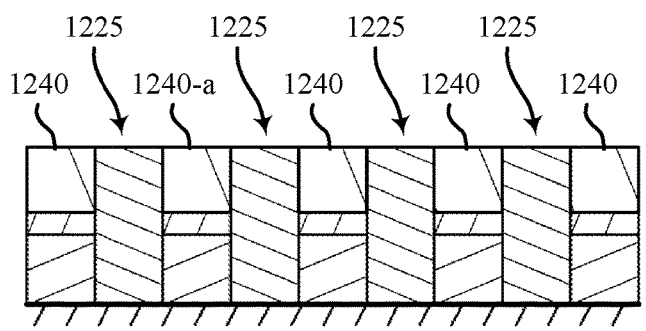

FIG. 12 illustrates top and cross-sectional views of an example of a ninth structure 1200 formed by an etch operation as part of a manufacturing process for forming self-aligned memory structures in accordance with examples as disclosed herein. The etch operation may be performed on the eighth structure 1100 to form the ninth structure 1200, and after performing the etch operation on the eighth structure 1100, the ninth structure 1200 may include memory material filling each memory cavity 1050 (FIG. 10) to a height of the first insulative sections 1025 (FIG. 10) to form memory cells 1240. As illustrated in the top and cross-sectional views (Section XIX-XIX and Sections XX-XX) a first memory cell 1420-a may be positioned between two first insulative sections 1225 having a first height and two second insulative sections 1235 having a second height. First insulative section 1225 and second insulative sections 1235 may be examples of insulative sections formed from insulating material as described herein. Alternatively, the ninth structure 1200 may be formed by selectively depositing a memory material 1240 into the memory cavities 1050 formed by the insulative sections 1025 and 1035 in the seventh structure (e.g., selectively depositing where the electrode material is exposed in the seventh structure), as discussed above.

Figure 13:
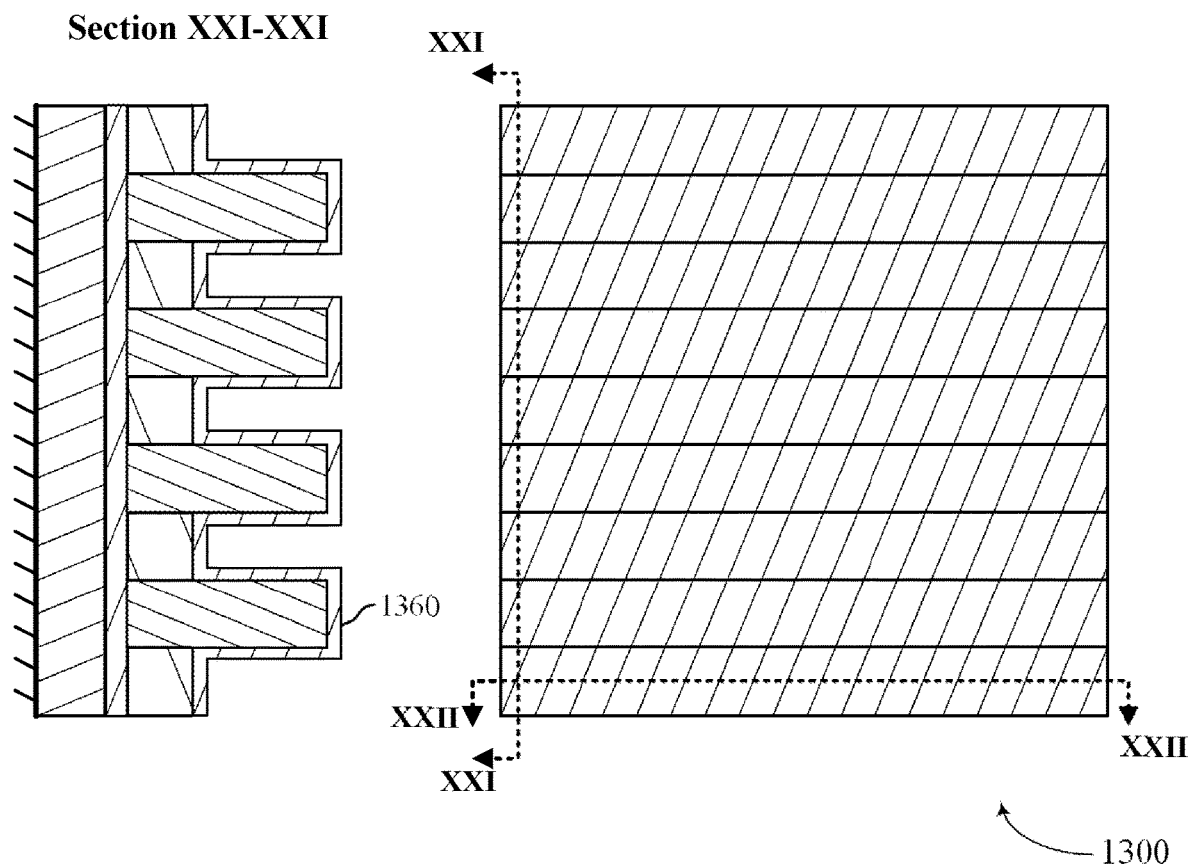
Figure 13:
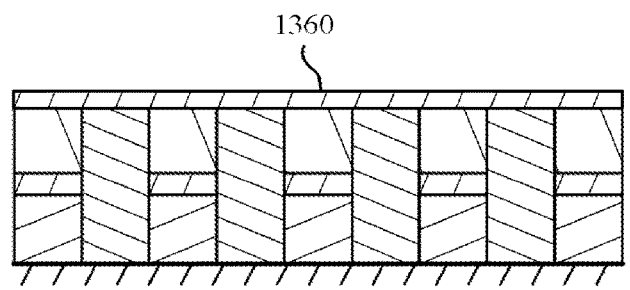

FIG. 13 illustrates top and cross-sectional views of an example of a tenth structure 1300 formed by an electrode depositing operation as part of a manufacturing process for forming self-aligned memory structures in accordance with examples as disclosed herein. The electrode depositing operation may be performed on the ninth structure 1200 to form the tenth structure 1300, and after performing the electrode depositing operation on the ninth structure 1200, the tenth structure 1300 may include an electrode material 1360 covering memory material in each memory cavity 1250 (FIG. 12).

In some cases, the electrode material 1360 may be deposited across a top surface of the ninth structure 1200. In these cases, the both the memory material and insulating materials may be coated by the electrode material 1360. That is, the electrode material may form a continuous layer across the top surface of the tenth structure 1300.

Figure 14:
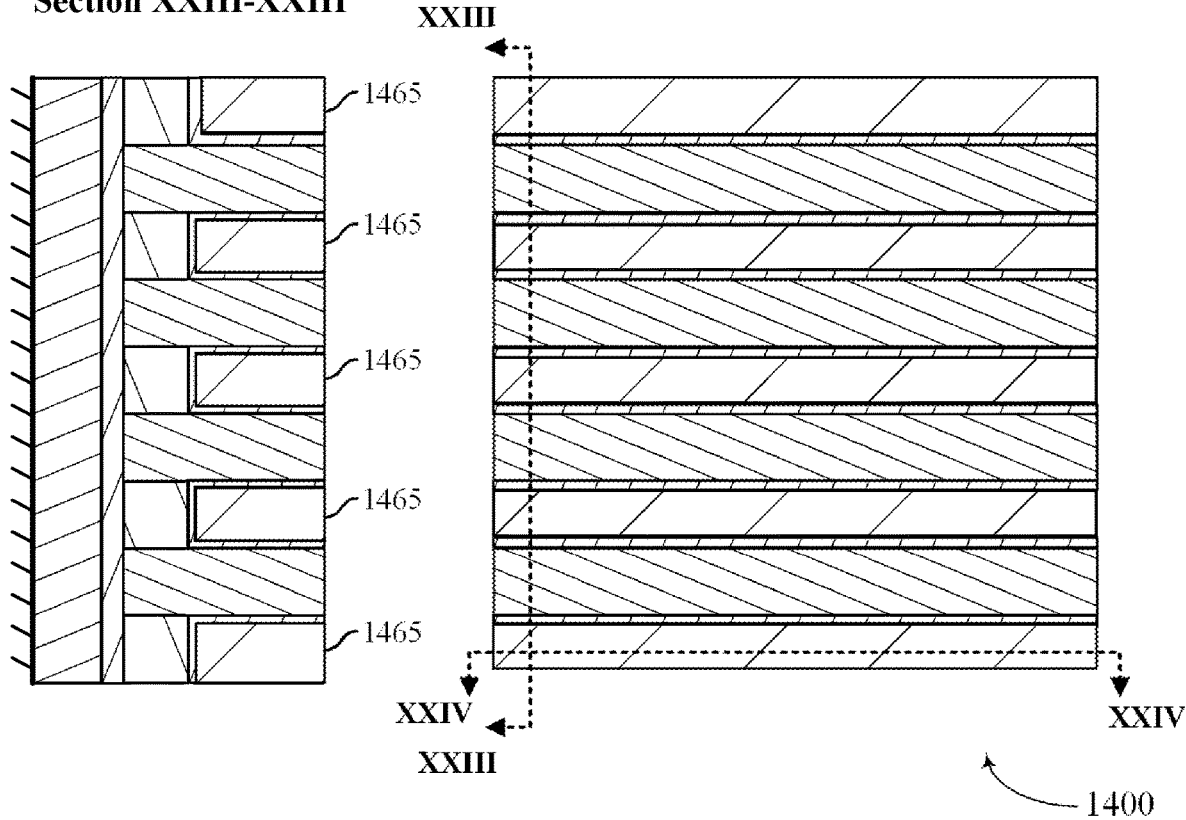
Figure 14:
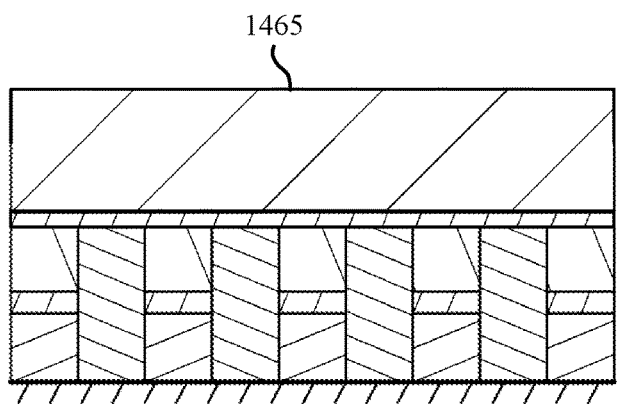

FIG. 14 illustrates top and cross-sectional views of an example of an eleventh structure 1400 formed by a conductor depositing operation as part of a manufacturing process for forming self-aligned memory structures in accordance with examples as disclosed herein. The conductor depositing operation may be performed on the tenth structure 1300 to form the eleventh structure 1400, and after performing the conductor depositing operation on the tenth structure 1300, the eleventh structure 1400 may include a second conductor material 1465 filling a top portion of the third channels 1030 (FIG. 10).

The second conductive material 1465 may be deposited onto the tenth structure 1300 to fill the portion of the third channels 1030 (FIG. 10) above the memory material and first insulative sections 1025 (FIG. 10). In some cases, the second conductive material may fill the third channels 1030 and cover a top surface of the tenth structure 1300. An etch or planarization procedure (e.g., chemical mechanical planarization) may be performed to remove the excess section conductive material 1465. Accordingly, the eleventh structure 1400 may include alternating sections of insulating material (e.g., second insulative sections 1235) and the second conductor material 1465.

Figure 15:
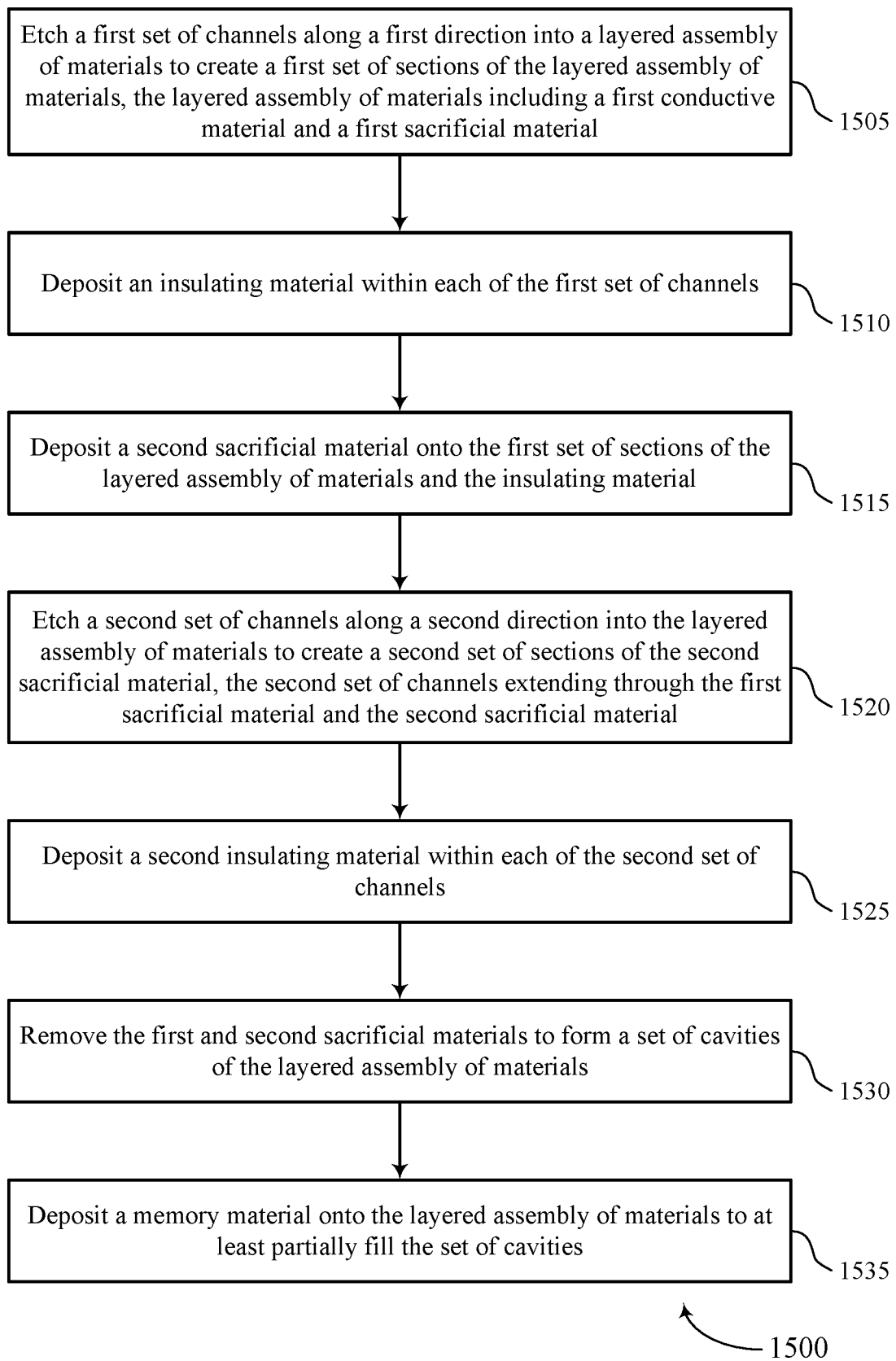
FIGS. 15 and 16 show flowcharts illustrating a method or methods that support techniques for forming self-aligned memory structures in accordance with examples as disclosed herein.

FIG. 15 shows a flowchart illustrating a method or methods 1500 that supports techniques for forming self-aligned memory structures in accordance with the present disclosure. The operations of method 1500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform parts of the described functions using special-purpose hardware.

At 1505, the method 1500 may include etching a first set of channels along a first direction into a layered assembly of materials to create a first set of sections of the layered assembly of materials, the layered assembly of materials including a first conductive material and a first sacrificial material. The operations of 1505 may be performed according to the methods described herein.

At 1510, the method 1500 may include depositing an insulating material within each of the first set of channels. The operations of 1510 may be performed according to the methods described herein.

At 1515, the method 1500 may include depositing a second sacrificial material onto the first set of sections of the layered assembly of materials and the insulating material. The operations of 1515 may be performed according to the methods described herein.

At 1520, the method 1500 may include etching a second set of channels along a second direction into the layered assembly of materials to create a second set of sections of the second sacrificial material, the second set of channels extending through the first sacrificial material and the second sacrificial material. The operations of 1520 may be performed according to the methods described herein.

At 1525, the method 1500 may include depositing a second insulating material within each of the second set of channels. The operations of 1525 may be performed according to the methods described herein.

At 1530, the method 1500 may include removing the first and second sacrificial materials to form a set of cavities of the layered assembly of materials. The operations of 1530 may be performed according to the methods described herein.

At 1535, the method 1500 may include depositing a memory material onto the layered assembly of materials to at least partially fill the set of cavities. The operations of 1535 may be performed according to the methods described herein.

In some examples, an apparatus as described herein may perform a method or methods, such as the method 1500. The apparatus may include features, means, or instructions (e.g., a non-transitory computer-readable medium storing instructions executable by a processor) for etching a first set of channels along a first direction into a layered assembly of materials to create a first set of sections of the layered assembly of materials, the layered assembly of materials including a first conductive material and a first sacrificial material, depositing an insulating material within each of the first set of channels, depositing a second sacrificial material onto the first set of sections of the layered assembly of materials and the insulating material, etching a second set of channels along a second direction into the layered assembly of materials to create a second set of sections of the second sacrificial material, the second set of channels extending through the first sacrificial material and the second sacrificial material, depositing a second insulating material within each of the second set of channels, removing the first and second sacrificial materials to form a set of cavities of the layered assembly of materials, and depositing a memory material onto the layered assembly of materials to at least partially fill the set of cavities. The apparatus may include, for example, physical vapor deposition equipment, chemical vapor deposition equipment, ion implantation equipment, etching (e.g., plasma etching, wet etching, dry etching) equipment, photolithography equipment (e.g., photoresist application equipment, steppers), planarization (e.g., chemical mechanical planarization) equipment, and the like.

Some examples of the method 1500 and the apparatus described herein may further include operations, features, means, or instructions for removing material from the layered assembly of materials after depositing the insulating material within each of the first set of channels to expose a surface of the first sacrificial material.

In some examples of the method 1500 and the apparatus described herein, the removing material includes chemical mechanical planarization.

Some examples of the method 1500 and the apparatus described herein may further include operations, features, means, or instructions for removing material from the layered assembly of materials after depositing the second insulating material within each of the second set of channels to expose a surface of the second sacrificial material.

In some examples of the method 1500 and the apparatus described herein, the removing material includes chemical mechanical planarization.

Some examples of the method 1500 and the apparatus described herein may further include operations, features, means, or instructions for depositing a second conductive material onto the memory material, where the second conductive material at least partially fills the second set of channels.

Some examples of the method 1500 and the apparatus described herein may further include operations, features, means, or instructions for depositing a first electrode material in a layer between the first conductive material and the first sacrificial material, and depositing a second electrode material onto the memory material before depositing the second conductive material.

In some examples of the method 1500 and the apparatus described herein, depositing the second electrode material may include operations, features, means, or instructions for performing a material removal process on the layered assembly of materials to expose the second insulating material.

In some examples of the method 1500 and the apparatus described herein, etching the first set of channels may include operations, features, means, or instructions for depositing a first mask material onto the first sacrificial material, and patterning the first mask material according to a first pattern used to etch the first set of channels.

Some examples of the method 1500 and the apparatus described herein may further include operations, features, means, or instructions for removing the first mask material after depositing the insulating material within each of the first set of channels.

In some examples of the method 1500 and the apparatus described herein, etching the second set of channels may include operations, features, means, or instructions for depositing a second mask material onto the second sacrificial material, and patterning the second mask material according to a second pattern used to each the second set of channels.

In some examples of the method 1500 and the apparatus described herein, the first direction may be orthogonal to the second direction.

In some examples of the method 1500 and the apparatus described herein, each of the set of cavities may be disposed between sections of the insulating material and the second insulating material.

Some examples of the method 1500 and the apparatus described herein may further include operations, features, means, or instructions for etching excess memory material after depositing the memory material to expose the second set of channels.

In some examples of the method 1500 and the apparatus described herein, depositing the memory material may include operations, features, means, or instructions for selectively depositing the memory material within the set of cavities.

In some examples of the method 1500 and the apparatus described herein, the memory material includes a chalcogenide material.

Some examples of the method 1500 and the apparatus described herein may further include operations, features, means, or instructions for etching the second set of channels divides the first sacrificial material of the first set of sections into a third set of sections.

Figure 16:
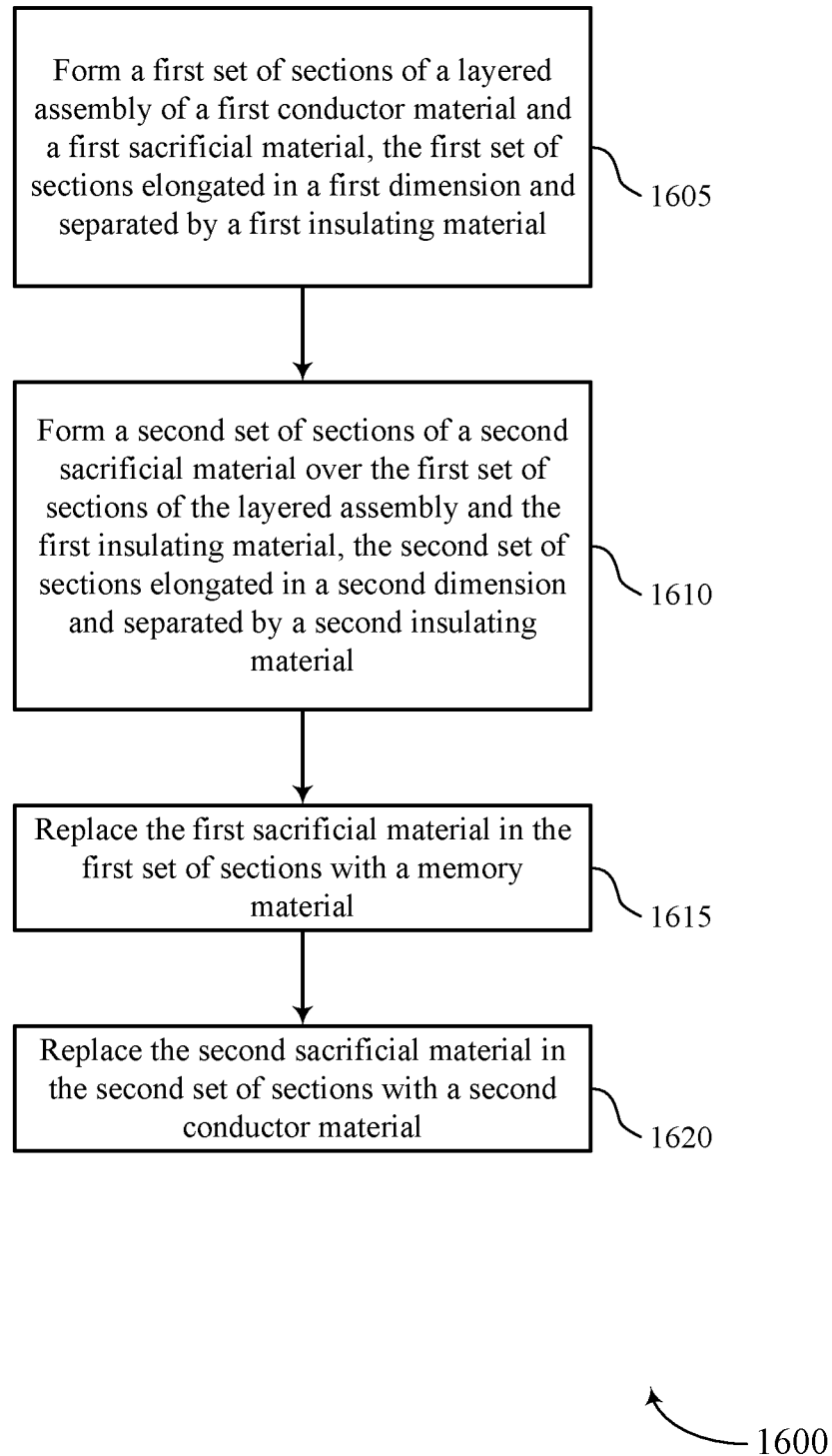

FIG. 16 shows a flowchart illustrating a method or methods 1600 that supports techniques for forming self-aligned memory structures in accordance with the present disclosure. The operations of method 1600 may be implemented by a manufacturing system or one or more controllers associated with a manufacturing. In some examples, one or more controllers may execute a set of instructions to control one or more functional elements of the manufacturing system to perform the described functions. Additionally or alternatively, one or more controllers may perform parts of the described functions using special-purpose hardware.

At 1605, the method 1600 may include forming a first set of sections of a layered assembly of a first conductor material and a first sacrificial material, the first set of sections elongated in a first dimension and separated by a first insulating material. The operations of 1605 may be performed according to the methods described herein.

At 1610, the method 1600 may include forming a second set of sections of a second sacrificial material over the first set of sections of the layered assembly and the first insulating material, the second set of sections elongated in a second dimension and separated by a second insulating material. The operations of 1610 may be performed according to the methods described herein.

At 1615, the method 1600 may include replacing the first sacrificial material in the first set of sections with a memory material. The operations of 1615 may be performed according to the methods described herein.

At 1620, the method 1600 may include replacing the second sacrificial material in the second set of sections with a second conductor material. The operations of 1620 may be performed according to the methods described herein.

In some examples, an apparatus as described herein may perform a method or methods, such as the method 1600. The apparatus may include features, means, or instructions (e.g., a non-transitory computer-readable medium storing instructions executable by a processor) for forming a first set of sections of a layered assembly of a first conductor material and a first sacrificial material, the first set of sections elongated in a first dimension and separated by a first insulating material, forming a second set of sections of a second sacrificial material over the first set of sections of the layered assembly and the first insulating material, the second set of sections elongated in a second dimension and separated by a second insulating material, replacing the first sacrificial material in the first set of sections with a memory material, and replacing the second sacrificial material in the second set of sections with a second conductor material. The apparatus may include, for example, physical vapor deposition equipment, chemical vapor deposition equipment, ion implantation equipment, etching (e.g., plasma etching, wet etching, dry etching) equipment, photolithography equipment (e.g., photoresist application equipment, steppers), planarization (e.g., chemical mechanical planarization) equipment, and the like.

In some examples of the method 1600 and the apparatus described herein, the first set of sections may be formed along a first direction, and the second set of sections may be formed along a second direction, different from the second direction, such that the memory material may be disposed between two first insulating materials and two second insulating materials.

In some examples of the method 1600 and the apparatus described herein, replacing the first sacrificial material with the memory material may include operations, features, means, or instructions for removing the first sacrificial material and the second sacrificial material, depositing the memory material onto the layered assembly, and removing portions of the memory material to form sections of the memory material having a same height as the first insulating material.

Some examples of the method 1600 and the apparatus described herein may further include operations, features, means, or instructions for forming an electrode between the first conductor material and the first sacrificial material.

In some examples of the method 1600 and the apparatus described herein, replacing the first sacrificial material with the memory material may include operations, features, means, or instructions for removing the first sacrificial material and the second sacrificial material, and selectively depositing the memory material onto portions of the layered assembly having the electrode exposed by removal of the first sacrificial material and the second sacrificial material.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of memory cells formed by a process including, deposit an insulating material within each of the first set of channels, deposit a second sacrificial material onto the first set of sections of the layered assembly of materials and the insulating material, etch a second set of channels along a second direction into the layered assembly of materials to create a second set of sections of the second sacrificial material, the second set of channels extending through the first sacrificial material and the second sacrificial material, deposit a second insulating material within each of the second set of channels, remove the first and second sacrificial materials to form a set of cavities of the layered assembly of materials, and deposit a memory material onto the layered assembly of materials to at least partially fill the set of cavities.

In some examples, the process further may include operations, features, means, or instructions for depositing an electrode material onto the layered assembly of materials after depositing the memory material, the electrode material forming a layer over the memory material and the second insulating material.

In some examples, the process further may include operations, features, means, or instructions for removing a portion of the layer of the electrode material disposed over a top surface of the second insulating material to expose the top surface of the second insulating material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain, and the unexposed regions may be removed.

Similarly, as used in the present disclosure, the terms "orthogonal" and "perpendicular," when used to describe geometric relationships, are not intended to suggest a limitation to precise geometric perpendicularity. For instance, the terms "orthogonal" and "perpendicular" as used in the present disclosure are intended to include typical deviations from geometric perpendicularity relating to such considerations as, for example, manufacturing and assembly tolerances. Further, certain manufacturing process such as molding, casting, depositing, and etching, may include or result in positive or negative drafting, edge chamfers and/or fillets, or other features to facilitate any of the manufacturing, assembly, or operation of various components, in which case certain surfaces may not be geometrically perpendicular, but may be perpendicular in the context of the present disclosure.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   forming a set of first sections of a layered assembly of materials comprising a layer of first placeholder material, a layer of electrode material, and a layer of conductive material above a substrate, each first section extending in a first direction;
   forming a set of first insulative sections, each first insulative section disposed between a respective pair of first sections of the set of first sections;
   forming a second placeholder material above the set of first sections and the set of first insulative sections;
   forming a set of second sections extending in a second direction, each second section comprising the second placeholder material;
   forming a set of second insulative sections, each second insulative section disposed between a respective pair of second sections of the set of second sections, wherein each second section of the respective pair of second sections includes the second placeholder material when the set of second insulative sections are formed;

forming a set of cavities, each cavity exposing an upper surface of the electrode material and exposing at least a portion of a respective sidewall of a first insulative section of the set of first insulative sections and a portion of a respective sidewall of a second insulative section of the set of second insulative sections; and depositing a memory material in each cavity of the set of cavities such that the memory material is in direct contact with an edge portion of the upper surface of the electrode material, wherein the edge portion abuts the respective sidewall of the first insulative section and the respective sidewall of the second insulative section, wherein the memory material in each cavity is deposited adjacent to the respective sidewall of the first insulative section and adjacent to the respective sidewall of the second insulative section.

2. The method of claim 1, wherein forming the set of cavities comprises:
removing the first placeholder material and the second placeholder material to expose the upper surface of the electrode material.

3. The method of claim 1, wherein forming the set of first sections comprises:
etching a set of channels extending in the first direction into the layered assembly, each channel exposing an upper surface of the substrate.

4. The method of claim 3, wherein etching the set of channels comprises:
depositing a mask material onto the first placeholder material; and
patterning the mask material according to a pattern used to etch the set of channels.

5. The method of claim 4, further comprising:
removing the mask material after forming the set of first sections.

6. The method of claim 3, wherein forming the set of first insulative sections comprises:
depositing an insulating material into each channel of the set of channels to fill the channel.

7. The method of claim 1, wherein forming the set of second sections comprises:
etching a set of channels extending in the second direction into the second placeholder material and a portion of the first placeholder material, each channel exposing a surface of the electrode material.

8. The method of claim 7, wherein forming the set of second insulative sections comprises:
depositing an insulating material into each channel of the set of channels to fill the channel.

9. The method of claim 7, wherein etching the set of channels comprises:
depositing a mask material onto the second placeholder material; and
patterning the mask material according to a pattern used to etch the set of channels.

10. The method of claim 1, further comprising:
forming a second electrode material on an upper surface of the memory material in each cavity, on an upper surface of each second insulative section of the set of second insulative sections, and on opposing sidewalls of each second insulative section of the set of second insulative sections.

11. The method of claim 10, further comprising:
forming a second conductive material on an upper surface of the second electrode material and between a pair of adjacent second insulative sections of the set of second insulative sections.

12. The method of claim 10, wherein forming the second electrode material comprises:
depositing the second electrode material over the memory material and the set of second insulative sections; and
performing a planarization process on the layered assembly of materials to expose upper surfaces of the set of second insulative sections.

13. The method of claim 1, wherein each cavity of the set of cavities is disposed between a respective pair of first insulative sections and a respective pair of second insulative sections.

14. The method of claim 1, wherein the memory material comprises a chalcogenide material.

15. A method, comprising:
forming a set of first sections of a layered assembly of a first conductor material, an electrode material, and a first placeholder material, the set of first sections separated by a first insulating material;
forming a set of second sections of a second placeholder material above the set of first sections and the first insulating material, the set of second sections separated by a second insulating material;
removing the first placeholder material and the second placeholder material to replace the first placeholder material in the set of first sections with a memory material, the replacing comprising depositing the memory material in contact with the first insulating material and the second insulating material, wherein a bottom surface of the memory material extends from a first side surface of the first insulating material to a second side surface of the second insulating material, and wherein the first placeholder material and the second placeholder material are removed during a same operation; and
replacing the second placeholder material in the set of second sections with a second conductor material.

16. The method of claim 15, wherein:
the set of first sections are formed along a first direction; and
the set of second sections are formed along a second direction, different from the first direction, wherein the memory material is disposed between two first insulating materials and two second insulating materials.

17. The method of claim 15, wherein replacing the first placeholder material with the memory material comprises:
depositing the memory material onto the layered assembly; and
removing portions of the memory material to form sections of the memory material having a same height as the first insulating material.

18. An apparatus, formed by a process comprising:
forming a set of first sections of a layered assembly of a first conductor material, an electrode material, and a first placeholder material, the set of first sections separated by a first insulating material;
forming a set of second sections of a second placeholder material above the set of first sections and the first insulating material, the set of second sections separated by a second insulating material;
removing the first placeholder material and the second placeholder material to replace the first placeholder material in the set of first sections with a memory material, the replacing comprising depositing the memory material in contact with the first insulating material and the second insulating material, wherein a bottom surface of the memory material extends from a first side surface of the first insulating material to a second side surface of the second insulating material, wherein the first placeholder material and the second placeholder material are removed during a same operation; and replacing the second placeholder material in the set of second sections with a second conductor material.

19. The apparatus of claim 18, wherein:

the set of first sections are formed along a first direction; and the set of second sections are formed along a second direction, different from the first direction, wherein the memory material is disposed between two first insulating materials and two second insulating materials.

20. The apparatus of claim 18, wherein replacing the first placeholder material with the memory material comprises:

depositing the memory material onto the layered assembly; and removing portions of the memory material to form sections of the memory material having a same height as the first insulating material.

* * * * *